United States Patent
LaChapelle

(10) Patent No.: US 11,029,406 B2
(45) Date of Patent: Jun. 8, 2021

(54) LIDAR SYSTEM WITH ALINASSB AVALANCHE PHOTODIODE

(71) Applicant: Luminar, LLC, Orlando, FL (US)

(72) Inventor: Joseph G. LaChapelle, Philomath, OR (US)

(73) Assignee: Luminar, LLC, Orlando, FL (US)

(*) Notice: Subject to any disclaimer, the term of this patent is extended or adjusted under 35 U.S.C. 154(b) by 279 days.

(21) Appl. No.: 15/947,308

(22) Filed: Apr. 6, 2018

(65) Prior Publication Data
US 2019/0310368 A1  Oct. 10, 2019

(51) Int. Cl.
| G01C 3/08 | (2006.01) |
| G01S 17/08 | (2006.01) |
| H01L 27/146 | (2006.01) |
| G02B 27/09 | (2006.01) |
| G01S 17/931 | (2020.01) |

(52) U.S. Cl.
CPC ............ G01S 17/08 (2013.01); G01S 17/931 (2020.01); G02B 27/0977 (2013.01); H01L 27/14643 (2013.01)

(58) Field of Classification Search
CPC . G02B 27/0977; G02B 26/101; G01S 7/4817; G01S 7/484; G01S 7/4861; G01S 17/08; G01S 17/10; G01S 17/93; G01S 17/931; H01L 31/1075; H01L 31/03046; H01L 27/14643
USPC ........................................................ 356/4.01
See application file for complete search history.

(56) References Cited

U.S. PATENT DOCUMENTS

| 5,006,721 | A | 4/1991 | Cameron et al. |
| 5,471,068 | A | 11/1995 | Tsuiji et al. |
| 6,449,384 | B2 | 9/2002 | Laumeyer et al. |
| 6,710,324 | B2 | 3/2004 | Hipp |
| 6,723,975 | B2 | 4/2004 | Saccomanno |
| 6,747,296 | B1 | 6/2004 | Clark |

(Continued)

FOREIGN PATENT DOCUMENTS

| WO | 2008/128359 | 10/2008 |
| WO | 2013/087799 | 6/2013 |

OTHER PUBLICATIONS

Maddox, "High-Gain, Low-Noise Avalanche Photodiodes Grown by Molecular Beam Epitaxy," Dissertation, The University of Texas at Austin (May 2015) pp. i-134.

(Continued)

*Primary Examiner* — Mark Hellner

(57) ABSTRACT

In one embodiment, a lidar system includes a light source configured to emit pulses of light and a scanner configured to scan the emitted pulses of light across a field of regard of the lidar system. The lidar system also includes a receiver configured to detect a portion of the emitted pulses of light scattered by a target located a distance from the lidar system. The receiver includes an aluminum-indium-arsenide-antimonide (AlInAsSb) avalanche photodiode (APD) configured to: receive a pulse of light of the portion of the emitted pulses of light scattered by the target and produce an electrical-current pulse corresponding to the received pulse of light. The lidar system further includes a processor configured to determine the distance from the lidar system to the target based at least in part on a round-trip time of flight for the received pulse of light.

23 Claims, 8 Drawing Sheets

(56) References Cited

U.S. PATENT DOCUMENTS

| | | |
|---|---|---|
| 6,747,747 B2 | 6/2004 | Hipp |
| 6,759,649 B2 | 7/2004 | Hipp |
| 7,045,833 B2 | 5/2006 | Campbell et al. |
| 7,049,640 B2 | 5/2006 | Boisvert et al. |
| 7,092,548 B2 | 5/2006 | Laumeyer et al. |
| 7,209,221 B2 | 4/2007 | Breed et al. |
| 7,345,271 B2 | 3/2008 | Boehlau et al. |
| 7,432,537 B1 | 10/2008 | Huntington |
| 7,443,903 B2 | 10/2008 | Leonardo et al. |
| 7,532,311 B2 | 5/2009 | Henderson et al. |
| 7,570,793 B2 | 8/2009 | Lages et al. |
| 7,583,364 B1 | 9/2009 | Mayor et al. |
| 7,649,920 B2 | 1/2010 | Welford |
| 7,652,752 B2 | 1/2010 | Fetzer et al. |
| 7,839,491 B2 | 11/2010 | Harris et al. |
| 7,872,794 B1 | 1/2011 | Minelly et al. |
| 7,902,570 B1 | 3/2011 | Itzler et al. |
| 7,945,408 B2 | 5/2011 | Dimsdale et al. |
| 7,969,558 B2 | 6/2011 | Hall |
| 7,995,796 B2 | 8/2011 | Retterath et al. |
| 8,059,263 B2 | 11/2011 | Haberer et al. |
| 8,072,663 B2 | 12/2011 | O'Neill et al. |
| 8,081,301 B2 | 12/2011 | Stann et al. |
| 8,138,849 B2 | 3/2012 | West et al. |
| 8,279,420 B2 | 10/2012 | Ludwig et al. |
| 8,280,623 B2 | 10/2012 | Trepagnier et al. |
| 8,346,480 B2 | 1/2013 | Trepagnier et al. |
| 8,364,334 B2 | 1/2013 | Au et al. |
| 8,452,561 B2 | 5/2013 | Dimsdale et al. |
| 8,548,014 B2 | 10/2013 | Fermann et al. |
| 8,625,080 B2 | 1/2014 | Heizmann et al. |
| 8,675,181 B2 | 3/2014 | Hall |
| 8,723,955 B2 | 5/2014 | Kiehn et al. |
| 8,767,190 B2 | 7/2014 | Hall |
| 8,796,605 B2 | 8/2014 | Mordarski et al. |
| 8,836,922 B1 | 9/2014 | Pennecot et al. |
| 8,880,296 B2 | 11/2014 | Breed |
| 8,896,818 B2 | 11/2014 | Walsh et al. |
| 8,934,509 B2 | 1/2015 | Savage-Leuchs et al. |
| 9,000,347 B2 | 4/2015 | Woodward et al. |
| 9,041,136 B2 | 5/2015 | Chia |
| 9,048,370 B1 | 6/2015 | Urmson et al. |
| 9,063,549 B1 | 6/2015 | Pennecot et al. |
| 9,069,060 B1 | 6/2015 | Zbrozek et al. |
| 9,074,878 B2 | 7/2015 | Steffey et al. |
| 9,086,273 B1 | 7/2015 | Gruver et al. |
| 9,086,481 B1 | 7/2015 | Dowdall et al. |
| 9,091,754 B2 | 7/2015 | D'aligny |
| 9,103,669 B2 | 8/2015 | Giacotto et al. |
| 9,121,703 B1 | 9/2015 | Droz et al. |
| 9,160,140 B2 | 10/2015 | Gusev et al. |
| 9,170,333 B2 | 10/2015 | Mheen et al. |
| 9,199,641 B2 | 12/2015 | Ferguson et al. |
| 9,213,085 B2 | 12/2015 | Kanter |
| 9,239,260 B2 | 1/2016 | Bayha et al. |
| 9,246,041 B1 | 1/2016 | Clausen et al. |
| 9,285,464 B2 | 3/2016 | Pennecot et al. |
| 9,285,477 B1 | 3/2016 | Smith et al. |
| 9,297,901 B2 | 3/2016 | Bayha et al. |
| 9,299,731 B1 | 3/2016 | Lenius et al. |
| 9,304,154 B1 | 4/2016 | Droz et al. |
| 9,304,203 B1 | 4/2016 | Droz et al. |
| 9,304,316 B2 | 4/2016 | Weiss et al. |
| 9,310,471 B2 | 4/2016 | Sayyah et al. |
| 9,335,255 B2 | 5/2016 | Retterath et al. |
| 9,360,554 B2 | 6/2016 | Retterath et al. |
| 9,368,933 B1 | 6/2016 | Nijjar et al. |
| 9,383,201 B2 | 7/2016 | Jackman et al. |
| 9,383,445 B2 | 7/2016 | Lu et al. |
| 9,383,753 B1 | 7/2016 | Templeton et al. |
| 9,748,430 B2 | 8/2017 | Bank et al. |
| 9,804,264 B2 | 10/2017 | Villeneuve et al. |
| 9,812,838 B2 | 11/2017 | Villeneuve et al. |
| 9,823,353 B2 | 11/2017 | Eichenholz et al. |
| RE46,672 E | 1/2018 | Hall |
| 9,857,468 B1 | 1/2018 | Eichenholz et al. |
| 9,874,635 B1 | 1/2018 | Eichenholz et al. |
| 9,958,545 B2 | 5/2018 | Eichenholz et al. |
| 10,032,950 B2 | 7/2018 | Campbell et al. |
| 2006/0290920 A1 | 12/2006 | Kampchen et al. |
| 2007/0164825 A1* | 7/2007 | Rollins ............... H03F 1/34 |
| | | 330/308 |
| 2009/0273770 A1 | 11/2009 | Bauhahn et al. |
| 2010/0034221 A1 | 2/2010 | Dragic |
| 2012/0227263 A1 | 9/2012 | Leclair et al. |
| 2013/0033742 A1 | 2/2013 | Rogers et al. |
| 2014/0111805 A1 | 4/2014 | Albert et al. |
| 2014/0168631 A1 | 6/2014 | Haslim et al. |
| 2014/0176933 A1 | 6/2014 | Haslim et al. |
| 2014/0211194 A1 | 7/2014 | Pacala et al. |
| 2014/0293263 A1 | 10/2014 | Justice et al. |
| 2014/0293266 A1 | 10/2014 | Hsu et al. |
| 2015/0131080 A1 | 5/2015 | Retterath et al. |
| 2015/0177368 A1 | 6/2015 | Bayha et al. |
| 2015/0185244 A1 | 7/2015 | Inoue et al. |
| 2015/0185313 A1 | 7/2015 | Zhu |
| 2015/0192676 A1 | 7/2015 | Kotelnikov et al. |
| 2015/0192677 A1 | 7/2015 | Yu et al. |
| 2015/0204978 A1 | 7/2015 | Hammes et al. |
| 2015/0214690 A1 | 7/2015 | Savage-Leuchs et al. |
| 2015/0301182 A1 | 10/2015 | Geiger et al. |
| 2015/0323654 A1 | 11/2015 | Jachmann et al. |
| 2015/0378023 A1 | 12/2015 | Royo Royo et al. |
| 2015/0378241 A1 | 12/2015 | Eldada |
| 2016/0025842 A1 | 1/2016 | Anderson et al. |
| 2016/0047896 A1 | 2/2016 | Dussan |
| 2016/0047901 A1 | 2/2016 | Pacala et al. |
| 2016/0049765 A1 | 2/2016 | Eldada |
| 2016/0146939 A1 | 5/2016 | Shpunt et al. |
| 2016/0146940 A1 | 5/2016 | Koehler |
| 2016/0161600 A1 | 6/2016 | Eldada et al. |
| 2016/0245919 A1 | 8/2016 | Kalscheur et al. |
| 2017/0153319 A1 | 6/2017 | Villeneuve et al. |
| 2017/0155225 A1 | 6/2017 | Villeneuve et al. |
| 2017/0205873 A1* | 7/2017 | Shpunt ............... B23P 19/04 |
| 2017/0244002 A1* | 8/2017 | Campbell ........... H01L 31/1075 |
| 2017/0261612 A1* | 9/2017 | Akiyama ............. G01S 7/4865 |
| 2018/0069367 A1 | 3/2018 | Villeneuve et al. |
| 2018/0120433 A1 | 5/2018 | Eichenholz et al. |
| 2018/0136337 A1* | 5/2018 | Zohar ................. G01S 7/4863 |
| 2018/0275252 A1* | 9/2018 | Fried .................. G01S 7/4816 |
| 2019/0196579 A1* | 6/2019 | Shpunt ................ G01S 7/4817 |
| 2019/0212445 A1* | 7/2019 | Hsiao .................... G01S 17/10 |
| 2019/0302246 A1* | 10/2019 | Donovan ............. G01S 7/4863 |
| 2020/0168756 A1 | 5/2020 | Rothman |

OTHER PUBLICATIONS

Farrell, "Design and Performance of Near-Infrared Nanowire Photodetectors," University of California, Los Angeles (2017).

Juang et al., "Optical Characterization of AlAsSb Digital Alloy and Random Alloy on GaSb," MDPI, Crystals 2017, 7, 313.

Juang, "Development of Antimonide-based Energy-sensitive Radiation Detectors," University of California, Los Angeles (2018).

Yi et al., "Demonstration of Large Ionization Coefficient Ratio in $AlAs_{0.56}Sb_{0.44}$ Lattice Matched to InP," Scientific Reports, 8:9107, Jun. 14, 2018.

Yi et al., "Extremely Low Excess Noise and High Sensitivity AlAs0.56Sb0.44 Avalanche Photodiodes," Nature Photonics, 13, 683-686 (2019).

Rockwell et al., "Toward Deterministic Construction of Low Noise Avalanche Photodetector Materials," Applied Physics Letters, 113, 102106 (2018).

Bai et al., "GHz low noise short wavelength infrared (SWIR) photoreceivers," Proc. SPIE, vol. 8037, 2011.

Bai et al., "Development of low excess noise SWIR APDs," Proc. SPIE, vol. 8353, 2012.

Bai, et al., "Development of High Sensitivity SWIR APD Receivers," Proc. SPIE, vol. 8704, 2013.

Bank, et al., "Avalanche photodiodes based on the AlInAsSb materials System," IEEE J. Sel. Top. Quantum Electron. 24, pp. 1-7, 2018.

(56) References Cited

OTHER PUBLICATIONS

Bank, et al., "Digital Alloy Growth of Low-Noise Avalanche Photodiodes," IEEE, pp. 67-69, Proc. IEEE Research and Applications of Photonics in Defense Conference (RAPID), pp. 67-69, 2018.
Bank, S. R. et al., "Final Report: Band Anti-Crossed Low Noise Avalanche Photodiode Materials," US Army Final report, Contract W911NF-Oct. 1, 0391, Nov. 2018.
Campbell, et al., "Recent Advances in Avalanche Photodiodes," IEEE Journal of Selected Topics in Quantum Electronics, vol. 10, No. 4, pp. 777-786, 2004.
Campbell, "Recent Advances in Telecommunications Avalanche Photodiodes," IEEE Journal of Lightwave Technology, vol. 25, No. 1, pp. 109-121, 2007.
Chang, et. al., "High material quality growth of AlInAsSb thin films on GaSb substrate by molecular beam epitaxy," Chin. Phys. B vol. 28, No. 2 (2019).
Duan et al., "High-Speed and Low-Noise SACM Avalanche Photodiodes with an Impact-Ionization-Engineered Multiplication Region," IEEE Photonics Technology Letters, vol. 17, No. 8, pp. 1719-1721, 2005.
Ferraro et al., "Position Sensing and High Bandwidth Data Communication Using Impact Ionization Engineered APD Arrays," IEEE Photonics Technology Letters, vol. 31, No. 1, pp. 58-61, 2019.
Fu, "Optical Characterization of AlInAsSb Digital Alloy Films," NNIN REU Research Accomplishments, 2015.
Hayat, et al., "Gain-bandwidth characteristics of thin avalanche photodiodes," IEEE Transactions on Electron Devices, vol. 49, No. 5, pp. 770-781, 2002.
Huntington, et al., "Linear-mode single-photon APD detectors," Proceedings SPIE vol. 6771, 2007.
Jiang, et al., "Optimization of InAlAsSb SACM APD with a heterojunction multiplication layer," J. Infrared Millim. Waves, vol. 38, No. 5, 2019.
Jones, et al., "Low-noise high-temperature AlInAsSb/GaSb avalanche photodiodes for 2-$\mu$m applications," Nature Photonics, published on-line May 18, 2020.
Juang, et al., "Optical Characterization of AlAsSb Digital Alloy and Random Alloy on GaSb Crystals," 7, 313; doi:10.3390/cryst7100313 pp. 1-8. 2005.
Kwon, "Optimal excess noise reduction in thin heterojunction A10.6Ga0.4As-GaAs avalanche photodiodes," e-Publications@Marquette, 2003.
Maddox, et al., "Broadly Tunable AlInAsSb Digital Alloys Grown on GaSb," Cryst. Growth Des. 16, pp. 3582-3586, 2016.
Maddox, et al., "Recent progress in avalanche photodiodes for sensing in the IR spectrum," Proc. of SPIE, vol. 9854, 2016.
Moreno, "Next generation avalanche photodiodes: realizing new potentials using nm wide avalanche regions," Thesis, The University of Sheffield, 2016.
Nada, et al., "High-speed III-V based avalanche photodiodes for optical communications—the forefront and expanding applications," Appl. Phys. Lett. 116, 2020.
Pilotto, et al., "A New Expression for the Gain-Noise Relation of Single Carrier Avalanche. Photodiodes with Arbitrary Staircase Multiplication Regions," IEEE Transactions on Electron Devices, vol. 66-4, pp. 1810-1814, 2019.
Pilotto, et al, "Optimization of GaAs/AlGaAs Staircase Avalanche Photodiodes Accounting for both Electron and Hole Impact Ionization," Solid-State Electronics vol. 168, Jun. 2020.
Ramirez, et al., "Non-Local Model for the Spatial Distribution of Impact Ionization Events in Avalanche Photodiodes," Epublications @ marquette.edu/electric/563, 2014.
Rees, et al., "Nonlocal impact ionization and avalanche multiplication," Journal of Physics D: Applied Physics, vol. 43, 2010.
Ren et al., "AlInAsSb separate absorption, charge, and multiplication avalanche photodiodes," Applied Physics Letters, 108, 2016.
Ren, et al., "AlInAsSb/GaSb staircase avalanche photodiode," Appl. Phys. Lett., vol. 108, No. 8, Feb. 2016.
Tang, et al., "Design of multi-gain-stage avalanche photodiodes with low excess noise," J. Infrared Millim. , vol. 38-4, 2019.
Tournet, et al., "Growth and characterization of AlInAsSb layers lattice-matched to GaSb Journal of Crystal Growth," Apr. 2017.
Wang, et al., "Low-Noise Impact-Ionization-Engineered Avalanche Photodiodes Grown on InP Substrates," IEEE Photonics Technology Letters, vol. 14, No. 12, pp. 1722-1724, 2002.
Williams, et al., "Instantaneous Receiver Operating Characteristic (ROC) Performance of Multi-Gain-Stage APD Photoreceivers," IEEE Journal of the Electron Devices Society, vol. 1, No. 6, pp. 145-153, 2013.
Williams, et al., "Multi-gain-stage InGaAs avalanche photodiode with enhanced gain and reduced excess noise," IEEE J. Electron. Devices Soc., vol. 1, No. 2, pp. 54-65, Feb. 2013.
Xie, et al., "AlAsSb avalanche photodiodes with a sub-mV/K temperature coefficient of breakdown voltage," IEEE Journal of Quantum Electronics, 47 (11), pp. 1391-1395, 2011.
Yuan, "Temperature dependence of the ionization coefficients of InAlAs and AlGaAs digital. alloys," vol. 6, No. 8/Photonics Research, pp. 794-799, Aug. 2018.
Yuan, et al., Stark-Localization-Limited Franz-Keldysh Effect in InAlAs Digital Alloys, Phys. Status Solidi, RRL, 2019.
Yuan, "Low-Noise Avalanche Photodiodes," Thesis University of Virginia Dec. 2019.
Yuan et al., "Comparison of Different Period Digital Alloy A10.7InAsSb Avalanche Photodiodes," Journal of Lightwave Technology, 2019.
Zhang et al., "Defect characterization of AlInAsSb digital alloy avalanche photodetectors with low frequency noise spectroscopy," Optics Express, vol. 28, No. 8, 13 Apr. 2020.
Zheng, et al., "Characterization of band offsets in AlxInl-xAsySbl-y alloys with varying Al composition," Appl. Phys. Lett. 115, 122105, 2019.
Zheng et al., "Simulations for InAlAs Digital Alloy Avalanche Photodiodes," Appl. Phys. Lett. 115, 171106, 2019.
Zheng et al., "Full band Monte Carlo simulation of AlInAsSb digital alloys," Wiley online library, journal/inf2, Info Mat. pp. 1-5, 2020.
Zhou, et al., "Thin All—xGaxAs0.56Sb0.44 Diodes with Low Excess Noise," IEEE Journal of Selected Topics in Quantum Electronics, vol. 24, No. 2, Mar./Apr. 2018.

\* cited by examiner

LIDAR SYSTEM WITH ALINASSB AVALANCHE PHOTODIODE

TECHNICAL FIELD

This disclosure generally relates to lidar systems.

BACKGROUND

Light detection and ranging (lidar) is a technology that can be used to measure distances to remote targets. Typically, a lidar system includes a light source and an optical receiver. The light source can be, for example, a laser which emits light having a particular operating wavelength. The operating wavelength of a lidar system may lie, for example, in the infrared, visible, or ultraviolet portions of the electromagnetic spectrum. The light source emits light toward a target which then scatters the light. Some of the scattered light is received back at the receiver. The system determines the distance to the target based on one or more characteristics associated with the returned light. For example, the system may determine the distance to the target based on the time of flight of a returned light pulse.

DESCRIPTION OF EXAMPLE EMBODIMENTS

Figure 1:
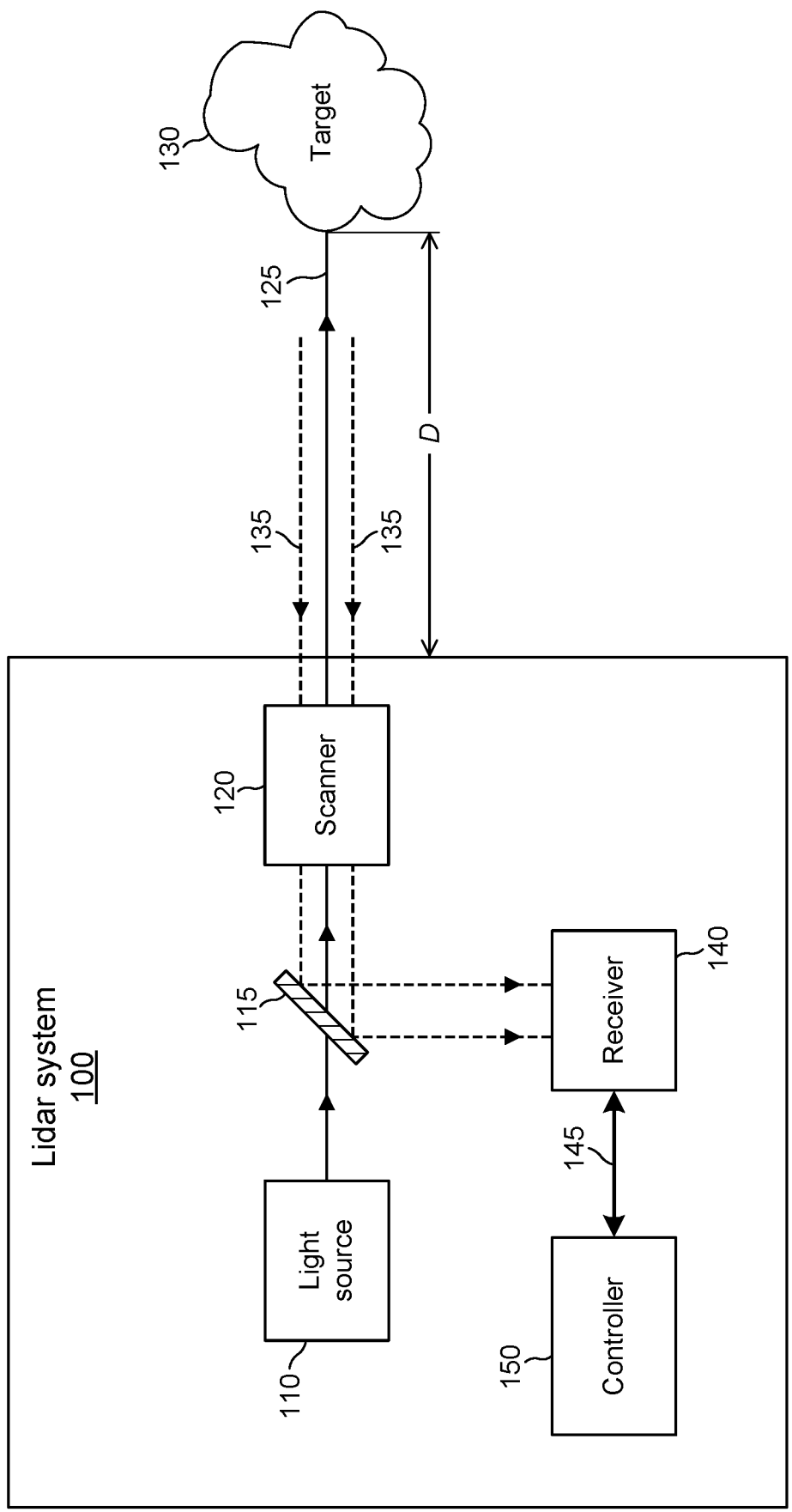
FIG. 1 illustrates an example light detection and ranging (lidar) system.

FIG. 1 illustrates an example light detection and ranging (lidar) system 100. In particular embodiments, a lidar system 100 may be referred to as a laser ranging system, a laser radar system, a LIDAR system, a lidar sensor, or a laser detection and ranging (LADAR or ladar) system. In particular embodiments, a lidar system 100 may include a light source 110, mirror 115, scanner 120, receiver 140, or controller 150. The light source 110 may be, for example, a laser which emits light having a particular operating wavelength in the infrared, visible, or ultraviolet portions of the electromagnetic spectrum. As an example, light source 110 may include a laser with an operating wavelength between approximately 1.2 µm and 1.7 µm. The light source 110 emits an output beam of light 125 which may be continuous-wave, pulsed, or modulated in any suitable manner for a given application. The output beam of light 125 is directed downrange toward a remote target 130. As an example, the remote target 130 may be located a distance D of approximately 1 m to 1 km from the lidar system 100.

Once the output beam 125 reaches the downrange target 130, the target may scatter or reflect at least a portion of light from the output beam 125, and some of the scattered or reflected light may return toward the lidar system 100. In the example of FIG. 1, the scattered or reflected light is represented by input beam 135, which passes through scanner 120 and is directed by mirror 115 to receiver 140. In particular embodiments, a relatively small fraction of the light from output beam 125 may return to the lidar system 100 as input beam 135. As an example, the ratio of input beam 135 average power, peak power, or pulse energy to output beam 125 average power, peak power, or pulse energy may be approximately $10^{-1}$, $10^{-2}$, $10^{-3}$, $10^{-4}$, $10^{-5}$, $10^{-6}$, $10^{-7}$, $10^{-8}$, $10^{-9}$, $10^{-10}$, $10^{-11}$, or $10^{-12}$. As another example, if a pulse of output beam 125 has a pulse energy of 1 microjoule (µJ), then the pulse energy of a corresponding pulse of input beam 135 may have a pulse energy of approximately 10 nanojoules (nJ), 1 nJ, 100 picojoules (pJ), 10 pJ, 1 pJ, 100 femtojoules (fJ), 10 fJ, 1 fJ, 100 attojoules (aJ), 10 aJ, 1 aJ, or 0.1 aJ. In particular embodiments, output beam 125 may be referred to as a laser beam, light beam, optical beam, emitted beam, or beam. In particular embodiments, input beam 135 may be referred to as a return beam, received beam, return light, received light, input light, scattered light, or reflected light. As used herein, scattered light may refer to light that is scattered or reflected by a target 130. As an example, an input beam 135 may include: light from the output beam 125 that is scattered by target 130; light from the output beam 125 that is reflected by target 130; or a combination of scattered and reflected light from target 130.

In particular embodiments, receiver 140 may receive or detect photons from input beam 135 and generate one or more representative signals. For example, the receiver 140 may generate an output electrical signal 145 that is representative of the input beam 135. This electrical signal 145 may be sent to controller 150. In particular embodiments, controller 150 may include a processor, computing system (e.g., an ASIC or FPGA), or other suitable circuitry. A controller 150 may be configured to analyze one or more characteristics of the electrical signal 145 from the receiver 140 to determine one or more characteristics of the target 130, such as its distance downrange from the lidar system 100. This can be done, for example, by analyzing the time of flight or phase modulation for a beam of light 125 transmitted by the light source 110. If lidar system 100 measures a time of flight of T (e.g., T represents a round-trip time of flight for an emitted pulse of light to travel from the lidar system 100 to the target 130 and back to the lidar system 100), then the distance D from the target 130 to the lidar system 100 may be expressed as $D = c \cdot T/2$, where c is the speed of light (approximately $3.0 \times 10^8$ m/s). As an example, if a time of flight is measured to be T=300 ns, then the distance from the target 130 to the lidar system 100 may be determined to be approximately D=45.0 m. As another example, if a time of flight is measured to be T=1.33 µs, then the distance from the target 130 to the lidar system 100 may be determined to be approximately D=199.5 m. In particular embodiments, a distance D from lidar system 100 to a target 130 may be referred to as a distance, depth, or range of target 130. As used herein, the speed of light c refers to the speed of light in any suitable medium, such as for example in air, water, or vacuum. As an example, the speed of light in vacuum is approximately $2.9979 \times 10^8$ m/s, and the speed of light in air (which has a refractive index of approximately 1.0003) is approximately $2.9970\times10^8$ m/s.

In particular embodiments, light source 110 may include a pulsed laser. As an example, light source 110 may be a pulsed laser configured to produce or emit pulses of light with a pulse duration or pulse width of approximately 10 picoseconds (ps) to 100 nanoseconds (ns). The pulses may have a pulse duration of approximately 100 ps, 200 ps, 400 ps, 1 ns, 2 ns, 5 ns, 10 ns, 20 ns, 50 ns, 100 ns, or any other suitable pulse duration. As another example, light source 110 may be a pulsed laser that produces pulses with a pulse duration of approximately 1-5 ns. As another example, light source 110 may be a pulsed laser that produces pulses at a pulse repetition frequency of approximately 100 kHz to 10 MHz or a pulse period (e.g., a time between consecutive pulses) of approximately 100 ns to 10 µs. In particular embodiments, light source 110 may have a substantially constant pulse repetition frequency, or light source 110 may have a variable or adjustable pulse repetition frequency. As an example, light source 110 may be a pulsed laser that produces pulses at a substantially constant pulse repetition frequency of approximately 640 kHz (e.g., 640,000 pulses per second), corresponding to a pulse period of approximately 1.56 µs. As another example, light source 110 may have a pulse repetition frequency that can be varied from approximately 500 kHz to 3 MHz. As used herein, a pulse of light may be referred to as an optical pulse, a light pulse, or a pulse.

In particular embodiments, light source 110 may produce optical pulses with a duty cycle of less than or equal to 10% (e.g., a duty cycle of approximately 0.01%, 0.02%, 0.05%, 0.1%, 0.2%, 0.5%, 1%, 2%, 5%, or 10%). A duty cycle may be determined from the ratio of pulse duration to pulse period or from the product of pulse duration and pulse repetition frequency. As an example, light source 110 may emit optical pulses with a pulse repetition frequency of 700 kHz and a pulse duration of 3 ns (which corresponds to a duty cycle of approximately 0.2%). As another example, light source 110 may emit optical pulses with a pulse repetition frequency of 1 MHz and a pulse duration of 10 ns (which corresponds to a duty cycle of approximately 1%).

In particular embodiments, light source 110 may produce a free-space output beam 125 having any suitable average optical power, and the output beam 125 may have optical pulses with any suitable pulse energy or peak optical power. As an example, output beam 125 may have an average power of approximately 1 milliwatt (mW), 10 mW, 100 mW, 1 watt (W), 10 W, or any other suitable average power. As another example, output beam 125 may include pulses with a pulse energy of approximately 0.01 µJ, 0.1 µJ, 1 µJ, 10 µJ, 100 µJ, 1 mJ, or any other suitable pulse energy. As another example, output beam 125 may include pulses with a peak power of approximately 10 W, 100 W, 1 kW, 5 kW, 10 kW, or any other suitable peak power. The peak power ($P_{peak}$) of a pulse of light can be related to the pulse energy (E) by the expression $E=P_{peak}\cdot\Delta t$, where $\Delta t$ is the duration of the pulse, and the duration of a pulse may be defined as the full width at half maximum duration of the pulse. For example, an optical pulse with a duration of 1 ns and a pulse energy of 1 µJ has a peak power of approximately 1 kW. The average power ($P_{av}$) of an output beam 125 can be related to the pulse repetition frequency (PRF) and pulse energy by the expression $P_{av}=PRF\cdot E$. For example, if the pulse repetition frequency is 500 kHz, then the average power of an output beam 125 with 1-µJ pulses is approximately 0.5 W.

In particular embodiments, light source 110 may include a laser diode, such as for example, a Fabry-Perot laser diode, a quantum well laser, a distributed Bragg reflector (DBR) laser, a distributed feedback (DFB) laser, or a vertical-cavity surface-emitting laser (VCSEL). As an example, light source 110 may include an aluminum-gallium-arsenide (AlGaAs) laser diode, an indium-gallium-arsenide (InGaAs) laser diode, an indium-gallium-arsenide-phosphide (InGaAsP) laser diode, or a laser diode that includes any suitable combination of aluminum (Al), indium (In), gallium (Ga), arsenic (As), phosphorous (P), or any other suitable material. In particular embodiments, light source 110 may include a pulsed laser diode with a peak emission wavelength between approximately 900 nanometers (nm) and approximately 2000 nm. As an example, light source 110 may have an operating wavelength of approximately 905 nm, 1100 nm, 1400 nm, 1500 nm, 1550 nm, 1600 nm, 1700 nm, or 2000 nm. As another example, light source 110 may have an operating wavelength between approximately 900 nm and approximately 1700 nm. As another example, light source 110 may include a laser diode with an operating wavelength of 1400-1600 nm, and the laser diode may be current modulated to produce optical pulses.

In particular embodiments, light source 110 may include a pulsed laser diode followed by one or more optical-amplification stages. The pulsed laser diode may produce relatively low-power optical seed pulses which are amplified by an optical amplifier. As an example, light source 110 may be a fiber-laser module that includes a current-modulated laser diode with a peak wavelength of approximately 1550 nm followed by a single-stage or a multi-stage erbium-doped fiber amplifier (EDFA) that amplifies the seed pulses from the laser diode. As another example, light source 110 may include a continuous-wave (CW) or quasi-CW laser diode followed by an external optical modulator (e.g., an electro-optic modulator), and the output of the modulator may be fed into an optical amplifier. In particular embodiments, light source 110 may include a laser diode which produces optical pulses that are not amplified by an optical amplifier. As an example, a laser diode (which may be referred to as a direct emitter or a direct-emitter laser diode) may emit optical pulses that form an output beam 125 that is directed downrange from a lidar system 100. A direct-emitter laser diode may be driven by an electrical power source that supplies current pulses to the laser diode, and each current pulse may result in the emission of an output optical pulse.

In particular embodiments, an output beam of light 125 emitted by light source 110 may be a collimated optical beam with any suitable beam divergence, such as for example, a divergence of approximately 0.5 to 5.0 milliradians (mrad). A divergence of output beam 125 may refer to an angular measure of an increase in beam size (e.g., a beam radius or beam diameter) as output beam 125 travels away from light source 110 or lidar system 100. In particular embodiments, output beam 125 may have a substantially circular cross section with a beam divergence characterized by a single divergence value. As an example, an output beam 125 with a circular cross section and a divergence of 2 mrad may have a beam diameter or spot size of approximately 20 cm at a distance of 100 m from lidar system 100. In particular embodiments, output beam 125 may be an astigmatic beam or may have a substantially elliptical cross section and may be characterized by two divergence values. As an example, output beam 125 may have a fast axis and a slow axis, where the fast-axis divergence is greater than the slow-axis divergence. As another example, output beam 125 may be an astigmatic beam with a fast-axis divergence of 4 mrad and a slow-axis divergence of 2 mrad.

In particular embodiments, an output beam of light 125 emitted by light source 110 may be unpolarized or randomly polarized, may have no specific or fixed polarization (e.g., the polarization may vary with time), or may have a particular polarization (e.g., output beam 125 may be linearly polarized, elliptically polarized, or circularly polarized). As an example, light source 110 may produce linearly polarized light, and lidar system 100 may include a quarter-wave plate that converts this linearly polarized light into circularly polarized light. The circularly polarized light may be transmitted as output beam 125, and lidar system 100 may receive input beam 135, which may be substantially or at least partially circularly polarized in the same manner as the output beam 125 (e.g., if output beam 125 is right-hand circularly polarized, then input beam 135 may also be right-hand circularly polarized). The input beam 135 may pass through the same quarter-wave plate (or a different quarter-wave plate) resulting in the input beam 135 being converted to linearly polarized light which is orthogonally polarized (e.g., polarized at a right angle) with respect to the linearly polarized light produced by light source 110. As another example, lidar system 100 may employ polarization-diversity detection where two polarization components are detected separately. The output beam 125 may be linearly polarized, and the lidar system 100 may split the input beam 135 into two polarization components (e.g., s-polarization and p-polarization) which are detected separately by two photodiodes (e.g., a balanced photoreceiver that includes two photodiodes).

In particular embodiments, lidar system 100 may include one or more optical components configured to condition, shape, filter, modify, steer, or direct the output beam 125 or the input beam 135. As an example, lidar system 100 may include one or more lenses, mirrors, filters (e.g., bandpass or interference filters), beam splitters, polarizers, polarizing beam splitters, wave plates (e.g., half-wave or quarter-wave plates), diffractive elements, or holographic elements. In particular embodiments, lidar system 100 may include a telescope, one or more lenses, or one or more mirrors to expand, focus, or collimate the output beam 125 to a desired beam diameter or divergence. As an example, the lidar system 100 may include one or more lenses to focus the input beam 135 onto an active region of receiver 140. As another example, the lidar system 100 may include one or more flat mirrors or curved mirrors (e.g., concave, convex, or parabolic mirrors) to steer or focus the output beam 125 or the input beam 135. For example, the lidar system 100 may include an off-axis parabolic mirror to focus the input beam 135 onto an active region of receiver 140. As illustrated in FIG. 1, the lidar system 100 may include mirror 115 (which may be a metallic or dielectric mirror), and mirror 115 may be configured so that light beam 125 passes through the mirror 115 or passes along an edge or side of the mirror 115. As an example, mirror 115 (which may be referred to as an overlap mirror, superposition mirror, or beam-combiner mirror) may include a hole, slot, or aperture which output light beam 125 passes through. As another example, mirror 115 may be configured so that at least 80% of output beam 125 passes through mirror 115 and at least 80% of input beam 135 is reflected by mirror 115. As another example, rather than passing through the mirror 115, the output beam 125 may be directed to pass alongside the mirror 115 with a gap (e.g., a gap of width approximately 0.1 mm, 0.5 mm, 1 mm, 2 mm, 5 mm, or 10 mm) between the output beam 125 and an edge of the mirror 115. In particular embodiments, mirror 115 may provide for output beam 125 and input beam 135 to be substantially coaxial so that the two beams travel along substantially the same optical path (albeit in opposite directions).

In particular embodiments, lidar system 100 may include a scanner 120 to steer the output beam 125 in one or more directions downrange. As an example, scanner 120 may include one or more scanning mirrors that are configured to rotate, oscillate, tilt, pivot, or move in an angular manner about one or more axes. In particular embodiments, a flat scanning mirror may be attached to a scanner actuator or mechanism which scans the mirror over a particular angular range. As an example, scanner 120 may include a galvanometer scanner, a resonant scanner, a piezoelectric actuator, a polygon-mirror scanner, a rotating-prism scanner, a voice coil motor, an electric motor (e.g., a DC motor, a brushless DC motor, a synchronous electric motor, or a stepper motor), or a microelectromechanical systems (MEMS) device, or any other suitable actuator or mechanism. In particular embodiments, scanner 120 may be configured to scan the output beam 125 over a 5-degree angular range, 20-degree angular range, 30-degree angular range, 60-degree angular range, or any other suitable angular range. As an example, a scanning mirror may be configured to periodically oscillate or rotate back and forth over a 15-degree range, which results in the output beam 125 scanning across a 30-degree range (e.g., a $\Theta$-degree rotation by a scanning mirror results in a $2\Theta$-degree angular scan of output beam 125). In particular embodiments, a field of regard (FOR) of a lidar system 100 may refer to an area, region, or angular range over which the lidar system 100 may be configured to scan or capture distance information. As an example, a lidar system 100 with an output beam 125 with a 30-degree scanning range may be referred to as having a 30-degree angular field of regard. As another example, a lidar system 100 with a scanning mirror that rotates over a 30-degree range may produce an output beam 125 that scans across a 60-degree range (e.g., a 60-degree FOR). In particular embodiments, lidar system 100 may have a FOR of approximately 10°, 20°, 40°, 60°, 120°, or any other suitable FOR. In particular embodiments, a FOR may be referred to as a scan region.

In particular embodiments, scanner 120 may be configured to scan the output beam 125 (which includes at least a portion of the pulses of light emitted by light source 110) across a FOR of the lidar system 100. In particular embodiments, scanner 120 may be configured to scan the output beam 125 horizontally and vertically, and lidar system 100 may have a particular FOR along the horizontal direction and another particular FOR along the vertical direction. As an example, lidar system 100 may have a horizontal FOR of 10° to 120° and a vertical FOR of 2° to 45°. In particular embodiments, scanner 120 may include a first mirror and a second mirror, where the first mirror directs the output beam 125 toward the second mirror, and the second mirror directs the output beam 125 downrange. As an example, the first mirror may scan the output beam 125 along a first direction, and the second mirror may scan the output beam 125 along a second direction that is substantially orthogonal to the first direction. As another example, the first mirror may scan the output beam 125 along a substantially horizontal direction, and the second mirror may scan the output beam 125 along a substantially vertical direction (or vice versa). In particular embodiments, scanner 120 may be referred to as a beam scanner, optical scanner, or laser scanner.

In particular embodiments, one or more scanning mirrors may be communicatively coupled to controller 150 which may control the scanning mirror(s) so as to guide the output beam 125 in a desired direction downrange or along a desired scan pattern. In particular embodiments, a scan pattern (which may be referred to as an optical scan pattern, optical scan path, or scan path) may refer to a pattern or path along which the output beam 125 is directed. As an example, scanner 120 may include two scanning mirrors configured to scan the output beam 125 across a 60° horizontal FOR and a 20° vertical FOR. The two scanner mirrors may be controlled to follow a scan path that substantially covers the 60°×20° FOR. As an example, the scan path may result in a point cloud with pixels that substantially cover the 60°×20° FOR. The pixels may be approximately evenly distributed across the 60°×20° FOR. Alternatively, the pixels may have a particular nonuniform distribution (e.g., the pixels may be distributed across all or a portion of the 60°×20° FOR, and the pixels may have a higher density in one or more particular regions of the 60°×20° FOR).

In particular embodiments, a light source 110 may emit pulses of light which are scanned by scanner 120 across a FOR of lidar system 100. One or more of the emitted pulses of light may be scattered by a target 130 located downrange from the lidar system 100, and a receiver 140 may detect at least a portion of the pulses of light scattered by the target 130. In particular embodiments, receiver 140 may be referred to as a photoreceiver, optical receiver, optical sensor, detector, photodetector, or optical detector. In particular embodiments, lidar system 100 may include a receiver 140 that receives or detects at least a portion of input beam 135 and produces an electrical signal that corresponds to input beam 135. As an example, if input beam 135 includes an optical pulse, then receiver 140 may produce an electrical current or voltage pulse that corresponds to the optical pulse detected by receiver 140. As another example, receiver 140 may include one or more avalanche photodiodes (APDs) or one or more single-photon avalanche diodes (SPADs). As another example, receiver 140 may include one or more PN photodiodes (e.g., a photodiode structure formed by a p-type semiconductor and a n-type semiconductor) or one or more PIN photodiodes (e.g., a photodiode structure formed by an undoped intrinsic semiconductor region located between p-type and n-type regions). Receiver 140 may have an active region or an avalanche-multiplication region that includes silicon, germanium, InGaAs, or AlInAsSb. The active region of receiver 140 may have any suitable size, such as for example, a diameter or width of approximately 20-500 μm.

In particular embodiments, receiver 140 may include circuitry that performs signal amplification, sampling, filtering, signal conditioning, analog-to-digital conversion, time-to-digital conversion, pulse detection, threshold detection, rising-edge detection, or falling-edge detection. As an example, receiver 140 may include a transimpedance amplifier that converts a received photocurrent (e.g., a current produced by an APD in response to a received optical signal) into a voltage signal. The voltage signal may be sent to pulse-detection circuitry that produces an analog or digital output signal 145 that corresponds to one or more characteristics (e.g., rising edge, falling edge, amplitude, or duration) of a received optical pulse. As an example, the pulse-detection circuitry may perform a time-to-digital conversion to produce a digital output signal 145. The electrical output signal 145 may be sent to controller 150 for processing or analysis (e.g., to determine a time-of-flight value corresponding to a received optical pulse).

In particular embodiments, controller 150 may be electrically coupled or communicatively coupled to light source 110, scanner 120, or receiver 140. As an example, controller 150 may receive electrical trigger pulses or edges from light source 110, where each pulse or edge corresponds to the emission of an optical pulse by light source 110. As another example, controller 150 may provide instructions, a control signal, or a trigger signal to light source 110 indicating when light source 110 should produce optical pulses. Controller 150 may send an electrical trigger signal that includes electrical pulses, where each electrical pulse results in the emission of an optical pulse by light source 110. In particular embodiments, the frequency, period, duration, pulse energy, peak power, average power, or wavelength of the optical pulses produced by light source 110 may be adjusted based on instructions, a control signal, or trigger pulses provided by controller 150. In particular embodiments, controller 150 may be coupled to light source 110 and receiver 140, and controller 150 may determine a time-of-flight value for an optical pulse based on timing information associated with when the pulse was emitted by light source 110 and when a portion of the pulse (e.g., input beam 135) was detected or received by receiver 140. In particular embodiments, controller 150 may include circuitry that performs signal amplification, sampling, filtering, signal conditioning, analog-to-digital conversion, time-to-digital conversion, pulse detection, threshold detection, rising-edge detection, or falling-edge detection.

In particular embodiments, a lidar system 100 may be used to determine the distance to one or more downrange targets 130. By scanning the lidar system 100 across a field of regard, the system can be used to map the distance to a number of points within the field of regard. Each of these depth-mapped points may be referred to as a pixel or a voxel. A collection of pixels captured in succession (which may be referred to as a depth map, a point cloud, or a frame) may be rendered as an image or may be analyzed to identify or detect objects or to determine a shape or distance of objects within the FOR. As an example, a point cloud may cover a field of regard that extends 60° horizontally and 15° vertically, and the point cloud may include a frame of 100-2000 pixels in the horizontal direction by 4-400 pixels in the vertical direction.

In particular embodiments, lidar system 100 may be configured to repeatedly capture or generate point clouds of a field of regard at any suitable frame rate between approximately 0.1 frames per second (FPS) and approximately 1,000 FPS. As an example, lidar system 100 may generate point clouds at a frame rate of approximately 0.1 FPS, 0.5 FPS, 1 FPS, 2 FPS, 5 FPS, 10 FPS, 20 FPS, 100 FPS, 500 FPS, or 1,000 FPS. As another example, lidar system 100 may be configured to produce optical pulses at a rate of $5 \times 10^5$ pulses/second (e.g., the system may determine 500,000 pixel distances per second) and scan a frame of 1000×50 pixels (e.g., 50,000 pixels/frame), which corresponds to a point-cloud frame rate of 10 frames per second (e.g., 10 point clouds per second). In particular embodiments, a point-cloud frame rate may be substantially fixed, or a point-cloud frame rate may be dynamically adjustable. As an example, a lidar system 100 may capture one or more point clouds at a particular frame rate (e.g., 1 Hz) and then switch to capture one or more point clouds at a different frame rate (e.g., 10 Hz). A slower frame rate (e.g., 1 Hz) may be used to capture one or more high-resolution point clouds, and a faster frame rate (e.g., 10 Hz) may be used to rapidly capture multiple lower-resolution point clouds.

In particular embodiments, a lidar system 100 may be configured to sense, identify, or determine distances to one or more targets 130 within a field of regard. As an example, a lidar system 100 may determine a distance to a target 130, where all or part of the target 130 is contained within a field of regard of the lidar system 100. All or part of a target 130 being contained within a FOR of the lidar system 100 may refer to the FOR overlapping, encompassing, or enclosing at least a portion of the target 130. In particular embodiments, target 130 may include all or part of an object that is moving or stationary relative to lidar system 100. As an example, target 130 may include all or a portion of a person, vehicle, motorcycle, truck, train, bicycle, wheelchair, pedestrian, animal, road sign, traffic light, lane marking, road-surface marking, parking space, pylon, guard rail, traffic barrier, pothole, railroad crossing, obstacle in or near a road, curb, stopped vehicle on or beside a road, utility pole, house, building, trash can, mailbox, tree, any other suitable object, or any suitable combination of all or part of two or more objects.

In particular embodiments, one or more lidar systems 100 may be integrated into a vehicle. As an example, multiple lidar systems 100 may be integrated into a car to provide a complete 360-degree horizontal FOR around the car. As another example, 4-10 lidar systems 100, each system having a 45-degree to 90-degree horizontal FOR, may be combined together to form a sensing system that provides a point cloud covering a 360-degree horizontal FOR. The lidar systems 100 may be oriented so that adjacent FORs have an amount of spatial or angular overlap to allow data from the multiple lidar systems 100 to be combined or stitched together to form a single or continuous 360-degree point cloud. As an example, the FOR of each lidar system 100 may have approximately 1-15 degrees of overlap with an adjacent FOR. In particular embodiments, a vehicle may refer to a mobile machine configured to transport people or cargo. For example, a vehicle may include, may take the form of, or may be referred to as a car, automobile, motor vehicle, truck, bus, van, trailer, off-road vehicle, farm vehicle, lawn mower, construction equipment, forklift, robot, golf cart, motorhome, taxi, motorcycle, scooter, bicycle, skateboard, train, snowmobile, watercraft (e.g., a ship or boat), aircraft (e.g., a fixed-wing aircraft, helicopter, or dirigible), or spacecraft. In particular embodiments, a vehicle may include an internal combustion engine or an electric motor that provides propulsion for the vehicle.

In particular embodiments, one or more lidar systems 100 may be included in a vehicle as part of an advanced driver assistance system (ADAS) to assist a driver of the vehicle in the driving process. For example, a lidar system 100 may be part of an ADAS that provides information or feedback to a driver (e.g., to alert the driver to potential problems or hazards) or that automatically takes control of part of a vehicle (e.g., a braking system or a steering system) to avoid collisions or accidents. A lidar system 100 may be part of a vehicle ADAS that provides adaptive cruise control, automated braking, automated parking, collision avoidance, alerts the driver to hazards or other vehicles, maintains the vehicle in the correct lane, or provides a warning if an object or another vehicle is in a blind spot.

In particular embodiments, one or more lidar systems 100 may be integrated into a vehicle as part of an autonomous-vehicle driving system. A lidar system 100 may provide information about the surrounding environment to a driving system of an autonomous vehicle. For example, a lidar system 100 may provide a greater than 30-degree view of an environment around a vehicle. As another example, one or more lidar systems 100 may provide a horizontal field of regard around a vehicle of approximately 30°, 45°, 60°, 90°, 120°, 180°, 270°, or 360°. An autonomous-vehicle driving system may include one or more computing systems that receive information from a lidar system 100 about the surrounding environment, analyze the received information, and provide control signals to the vehicle's driving systems (e.g., steering wheel, accelerator, brake, or turn signal). As an example, a lidar system 100 integrated into an autonomous vehicle may provide an autonomous-vehicle driving system with a point cloud every 0.1 seconds (e.g., the point cloud has a 10 Hz update rate, representing 10 frames per second). The autonomous-vehicle driving system may analyze the received point clouds to sense or identify targets 130 and their respective locations, distances, or speeds, and the autonomous-vehicle driving system may update control signals based on this information. As an example, if lidar system 100 detects a vehicle ahead that is slowing down or stopping, the autonomous-vehicle driving system may send instructions to release the accelerator and apply the brakes.

In particular embodiments, an autonomous vehicle may be referred to as an autonomous car, driverless car, self-driving car, robotic car, or unmanned vehicle. In particular embodiments, an autonomous vehicle may refer to a vehicle configured to sense its environment and navigate or drive with little or no human input. As an example, an autonomous vehicle may be configured to drive to any suitable location and control or perform all safety-critical functions (e.g., driving, steering, braking, parking) for the entire trip, with the driver not expected to control the vehicle at any time. As another example, an autonomous vehicle may allow a driver to safely turn their attention away from driving tasks in particular environments (e.g., on freeways), or an autonomous vehicle may provide control of a vehicle in all but a few environments, requiring little or no input or attention from the driver.

In particular embodiments, an autonomous vehicle may be configured to drive with a driver present in the vehicle, or an autonomous vehicle may be configured to operate the vehicle with no driver present. As an example, an autonomous vehicle may include a driver's seat with associated controls (e.g., steering wheel, accelerator pedal, and brake pedal), and the vehicle may be configured to drive with no one seated in the driver's seat or with little or no input from a person seated in the driver's seat. As another example, an autonomous vehicle may not include any driver's seat or associated driver's controls, and the vehicle may perform substantially all driving functions (e.g., driving, steering, braking, parking, and navigating) without human input. As another example, an autonomous vehicle may be configured to operate without a driver (e.g., the vehicle may be configured to transport human passengers or cargo without a driver present in the vehicle). As another example, an autonomous vehicle may be configured to operate without any human passengers (e.g., the vehicle may be configured for transportation of cargo without having any human passengers onboard the vehicle).

Figure 2:
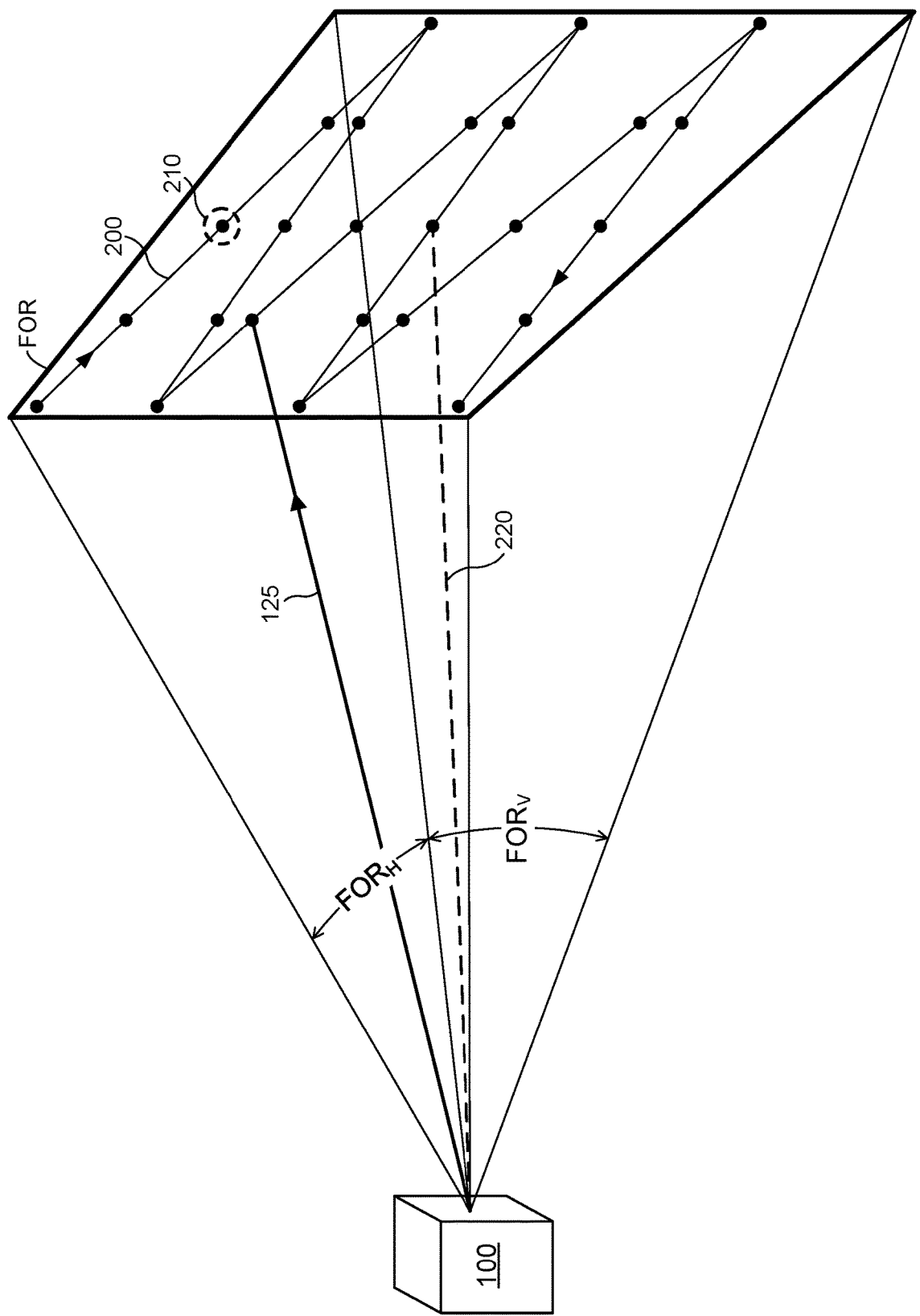
FIG. 2 illustrates an example scan pattern produced by a lidar system.

FIG. 2 illustrates an example scan pattern 200 produced by a lidar system 100. A scan pattern 200 (which may be referred to as a scan) may represent a path or course followed by output beam 125 as it is scanned across all or part of a FOR. Each traversal of a scan pattern 200 may correspond to the capture of a single frame or a single point cloud. In particular embodiments, a lidar system 100 may be configured to scan output optical beam 125 along one or more particular scan patterns 200. In particular embodiments, a scan pattern 200 may scan across any suitable field of regard (FOR) having any suitable horizontal FOR ($FOR_H$) and any suitable vertical FOR ($FOR_V$). For example, a scan pattern 200 may have a field of regard represented by angular dimensions (e.g., $FOR_H \times FOR_V$) 40°×30°, 90°×40°, or 60°×15°. As another example, a scan pattern 200 may have a $FOR_H$ greater than or equal to 10°, 25°, 30°, 40°, 60°, 90°, or 120°. As another example, a scan pattern 200 may have a FOR$_V$ greater than or equal to 2°, 5°, 10°, 15°, 20°, 30°, or 45°. In the example of FIG. 2, reference line 220 represents a center of the field of regard of scan pattern 200. In particular embodiments, reference line 220 may have any suitable orientation, such as for example, a horizontal angle of 0° (e.g., reference line 220 may be oriented straight ahead) and a vertical angle of 0° (e.g., reference line 220 may have an inclination of 0°), or reference line 220 may have a nonzero horizontal angle or a nonzero inclination (e.g., a vertical angle of +10° or −10°). In FIG. 2, if the scan pattern 200 has a 60°×15° field of regard, then scan pattern 200 covers a ±30° horizontal range with respect to reference line 220 and a ±7.5° vertical range with respect to reference line 220. Additionally, optical beam 125 in FIG. 2 has an orientation of approximately −15° horizontal and +3° vertical with respect to reference line 220. Optical beam 125 may be referred to as having an azimuth of −15° and an altitude of +3° relative to reference line 220. In particular embodiments, an azimuth (which may be referred to as an azimuth angle) may represent a horizontal angle with respect to reference line 220, and an altitude (which may be referred to as an altitude angle, elevation, or elevation angle) may represent a vertical angle with respect to reference line 220.

In particular embodiments, a scan pattern 200 may include multiple pixels 210, and each pixel 210 may be associated with one or more laser pulses and one or more corresponding distance measurements. In particular embodiments, a cycle of scan pattern 200 may include a total of $P_x \times P_y$ pixels 210 (e.g., a two-dimensional distribution of $P_x$ by $P_y$ pixels). As an example, scan pattern 200 may include a distribution with dimensions of approximately 100-2,000 pixels 210 along a horizontal direction and approximately 4-400 pixels 210 along a vertical direction. As another example, scan pattern 200 may include a distribution of 1,000 pixels 210 along the horizontal direction by 64 pixels 210 along the vertical direction (e.g., the frame size is 1000×64 pixels) for a total of 64,000 pixels per cycle of scan pattern 200. In particular embodiments, the number of pixels 210 along a horizontal direction may be referred to as a horizontal resolution of scan pattern 200, and the number of pixels 210 along a vertical direction may be referred to as a vertical resolution. As an example, scan pattern 200 may have a horizontal resolution of greater than or equal to 100 pixels 210 and a vertical resolution of greater than or equal to 4 pixels 210. As another example, scan pattern 200 may have a horizontal resolution of 100-2,000 pixels 210 and a vertical resolution of 4-400 pixels 210.

In particular embodiments, each pixel 210 may be associated with a distance (e.g., a distance to a portion of a target 130 from which an associated laser pulse was scattered) or one or more angular values. As an example, a pixel 210 may be associated with a distance value and two angular values (e.g., an azimuth and altitude) that represent the angular location of the pixel 210 with respect to the lidar system 100. A distance to a portion of target 130 may be determined based at least in part on a time-of-flight measurement for a corresponding pulse. An angular value (e.g., an azimuth or altitude) may correspond to an angle (e.g., relative to reference line 220) of output beam 125 (e.g., when a corresponding pulse is emitted from lidar system 100) or an angle of input beam 135 (e.g., when an input signal is received by lidar system 100). In particular embodiments, an angular value may be determined based at least in part on a position of a component of scanner 120. As an example, an azimuth or altitude value associated with a pixel 210 may be determined from an angular position of one or more corresponding scanning mirrors of scanner 120.

Figure 3:
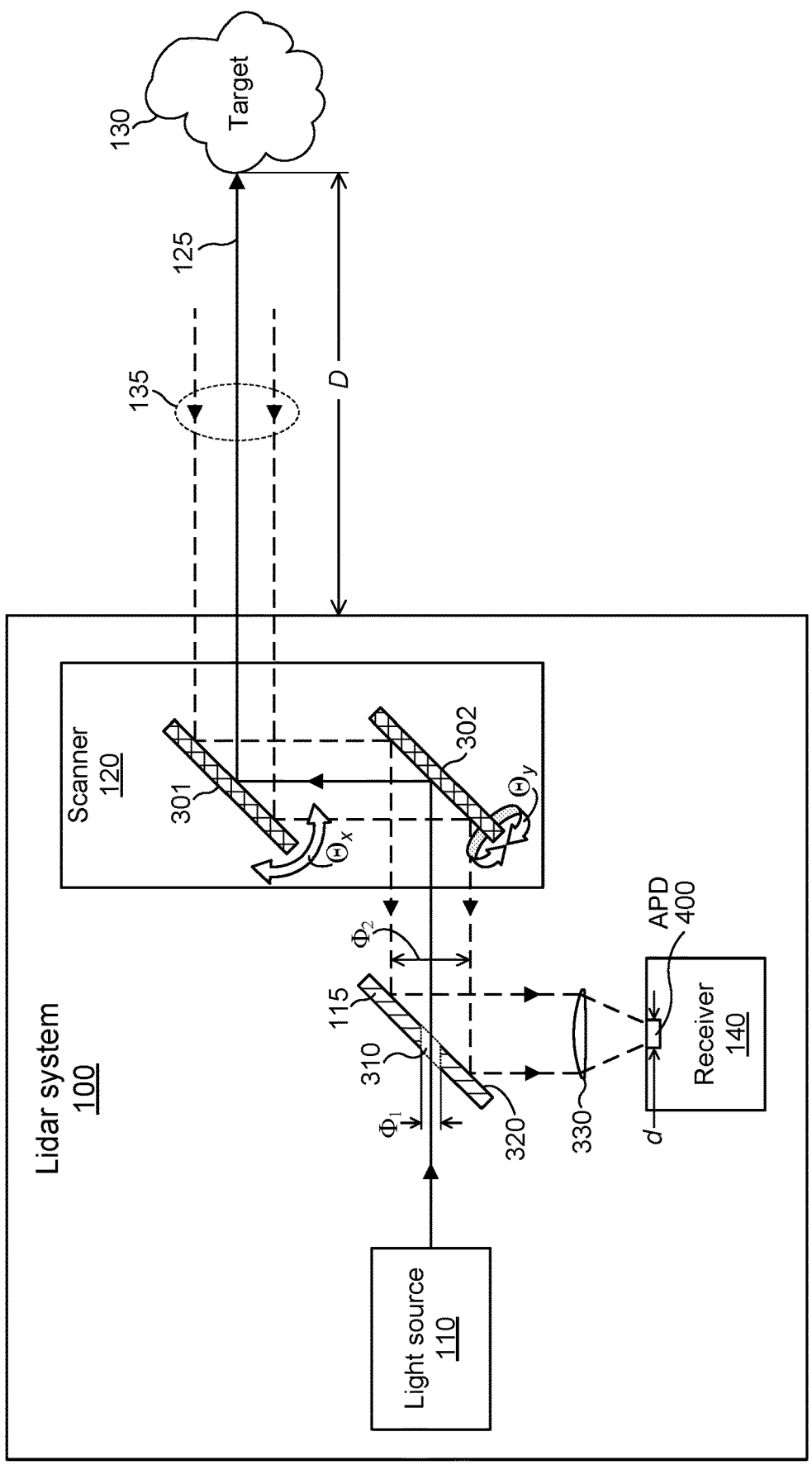
FIG. 3 illustrates an example lidar system with an example overlap mirror.

FIG. 3 illustrates an example lidar system 100 with an example overlap mirror 115. In particular embodiments, a lidar system 100 may include a light source 110 configured to emit pulses of light and a scanner 120 configured to scan at least a portion of the emitted pulses of light across a field of regard. As an example, the light source 110 may include a pulsed solid-state laser, a pulsed fiber laser, or a direct-emitter laser diode, and the optical pulses produced by the light source 110 may be directed through aperture 310 of overlap mirror 115 and then coupled to scanner 120. In particular embodiments, a lidar system 100 may include a receiver 140 configured to detect at least a portion of the scanned pulses of light scattered by a target 130 located a distance D from the lidar system 100. As an example, one or more pulses of light that are directed downrange from lidar system 100 by scanner 120 (e.g., as part of output beam 125) may scatter off a target 130, and a portion of the scattered light may propagate back to the lidar system 100 (e.g., as part of input beam 135) and be detected by receiver 140.

In particular embodiments, lidar system 100 may include one or more processors (e.g., a controller 150) configured to determine a distance D from the lidar system 100 to a target 130 based at least in part on a round-trip time of flight for an emitted pulse of light to travel from the lidar system 100 to the target 130 and back to the lidar system 100. The target 130 may be at least partially contained within a field of regard of the lidar system 100 and located a distance D from the lidar system 100 that is less than or equal to a maximum range $R_{MAX}$ of the lidar system 100. In particular embodiments, a maximum range (which may be referred to as a maximum distance) of a lidar system 100 may refer to the maximum distance over which the lidar system 100 is configured to sense or identify targets 130 that appear in a field of regard of the lidar system 100. The maximum range of lidar system 100 may be any suitable distance, such as for example, 25 m, 50 m, 100 m, 200 m, 500 m, or 1 km. As an example, a lidar system 100 with a 200-m maximum range may be configured to sense or identify various targets 130 located up to 200 m away from the lidar system 100. For a lidar system 100 with a 200-m maximum range ($R_{MAX}$=200 m), the time of flight corresponding to the maximum range is approximately $2 \cdot R_{MAX}/c \cong 1.33$ μs.

In particular embodiments, light source 110, scanner 120, and receiver 140 may be packaged together within a single housing, where a housing may refer to a box, case, or enclosure that holds or contains all or part of a lidar system 100. As an example, a lidar-system enclosure may contain a light source 110, overlap mirror 115, scanner 120, and receiver 140 of a lidar system 100. Additionally, the lidar-system enclosure may include a controller 150. The lidar-system enclosure may also include one or more electrical connections for conveying electrical power or electrical signals to or from the enclosure. In particular embodiments, one or more components of a lidar system 100 may be located remotely from a lidar-system enclosure. As an example, all or part of light source 110 may be located remotely from a lidar-system enclosure, and pulses of light produced by the light source 110 may be conveyed to the enclosure via optical fiber. As another example, all or part of a controller 150 may be located remotely from a lidar-system enclosure.

In particular embodiments, light source 110 may include an eye-safe laser, or lidar system 100 may be classified as an eye-safe laser system or laser product. An eye-safe laser, laser system, or laser product may refer to a system that includes a laser with an emission wavelength, average power, peak power, peak intensity, pulse energy, beam size, beam divergence, exposure time, or scanned output beam such that emitted light from the system presents little or no possibility of causing damage to a person's eyes. As an example, light source 110 or lidar system 100 may be classified as a Class 1 laser product (as specified by the 60825-1 standard of the International Electrotechnical Commission (IEC)) or a Class I laser product (as specified by Title 21, Section 1040.10 of the United States Code of Federal Regulations (CFR)) that is safe under all conditions of normal use. In particular embodiments, lidar system 100 may be an eye-safe laser product (e.g., with a Class 1 or Class I classification) configured to operate in an eye-safe manner at any suitable wavelength between approximately 1400 nm and approximately 2100 nm. As an example, lidar system 100 may include a laser with an operating wavelength between approximately 1400 nm and approximately 1600 nm, and the laser or the lidar system 100 may be operated in an eye-safe manner. As another example, lidar system 100 may be an eye-safe laser product that includes a scanned laser with an operating wavelength between approximately 1530 nm and approximately 1560 nm. As another example, lidar system 100 may be a Class 1 or Class I laser product that includes a fiber laser, solid-state laser, or direct-emitter laser diode with an operating wavelength between approximately 1400 nm and approximately 1600 nm.

In particular embodiments, scanner 120 may include one or more mirrors, where each mirror is mechanically driven by a galvanometer scanner, a resonant scanner, a MEMS device, a voice coil motor, an electric motor, or any suitable combination thereof. A galvanometer scanner (which may be referred to as a galvanometer actuator) may include a galvanometer-based scanning motor with a magnet and coil. When an electrical current is supplied to the coil, a rotational force is applied to the magnet, which causes a mirror attached to the galvanometer scanner to rotate. The electrical current supplied to the coil may be controlled to dynamically change the position of the galvanometer mirror. A resonant scanner (which may be referred to as a resonant actuator) may include a spring-like mechanism driven by an actuator to produce a periodic oscillation at a substantially fixed frequency (e.g., 1 kHz). A MEMS-based scanning device may include a mirror with a diameter between approximately 1 and 10 mm, where the mirror is rotated back and forth using electromagnetic or electrostatic actuation. A voice coil motor (which may be referred to as a voice coil actuator) may include a magnet and coil. When an electrical current is supplied to the coil, a translational force is applied to the magnet, which causes a mirror attached to the magnet to move or rotate. An electric motor, such as for example, a brushless DC motor or a synchronous electric motor, may be used to continuously rotate a mirror (e.g., a polygon mirror) at a substantially fixed frequency (e.g., a rotational frequency of approximately 1 Hz, 10 Hz, 50 Hz, 100 Hz, 500 Hz, or 1,000 Hz). The mirror may be continuously rotated in one rotation direction (e.g., clockwise or counter-clockwise relative to a particular rotation axis).

In particular embodiments, a scanner 120 may include any suitable number of mirrors driven by any suitable number of mechanical actuators. As an example, a scanner 120 may include a single mirror configured to scan an output beam 125 along a single direction (e.g., a scanner 120 may be a one-dimensional scanner that scans along a horizontal or vertical direction). The mirror may be driven by one actuator (e.g., a galvanometer) or two actuators configured to drive the mirror in a push-pull configuration. As another example, a scanner 120 may include a single mirror that scans an output beam 125 along two directions (e.g., horizontal and vertical). The mirror may be driven by two actuators, where each actuator provides rotational motion along a particular direction or about a particular axis. As another example, a scanner 120 may include two mirrors, where one mirror scans an output beam 125 along a substantially horizontal direction and the other mirror scans the output beam 125 along a substantially vertical direction. In the example of FIG. 3, scanner 120 includes two mirrors, mirror 301 and mirror 302. Mirror 301 rotates along the $\Theta_x$ direction and scans output beam 125 along a substantially horizontal direction, and mirror 302 rotates along the $\Theta_y$ direction and scans output beam 125 along a substantially vertical direction.

In particular embodiments, a scanner 120 may include two mirrors, where each mirror is driven by a corresponding galvanometer scanner. As an example, scanner 120 may include a galvanometer actuator that scans mirror 301 along a first direction (e.g., horizontal), and scanner 120 may include another galvanometer actuator that scans mirror 302 along a second direction (e.g., vertical). In particular embodiments, a scanner 120 may include two mirrors, where one mirror is driven by a resonant actuator and the other mirror is driven by a galvanometer actuator. As an example, a resonant actuator may scan mirror 301 along a first direction, and a galvanometer actuator may scan mirror 302 along a second direction. The first and second scanning directions may be substantially orthogonal to one another. As an example, the first direction may be substantially horizontal, and the second direction may be substantially vertical, or vice versa. In particular embodiments, a scanner 120 may include two mirrors, where one mirror is driven by an electric motor and the other mirror is driven by a galvanometer actuator. As an example, mirror 301 may be a polygon mirror that is rotated about a fixed axis by an electric motor (e.g., a brushless DC motor), and mirror 302 may be driven by a galvanometer or MEMS actuator. In particular embodiments, a scanner 120 may include two mirrors, where both mirrors are driven by electric motors. As an example, mirror 301 may be a polygon mirror driven by an electric motor, and mirror 302 may be driven by another electric motor. In particular embodiments, a scanner 120 may include one mirror driven by two actuators which are configured to scan the mirror along two substantially orthogonal directions. As an example, one mirror may be driven along a substantially horizontal direction by a resonant actuator or a galvanometer actuator, and the mirror may also be driven along a substantially vertical direction by a galvanometer actuator. As another example, a mirror may be driven along two substantially orthogonal directions by two resonant actuators or by two electric motors.

In particular embodiments, a scanner 120 may include a mirror configured to be scanned along one direction by two actuators arranged in a push-pull configuration. Driving a mirror in a push-pull configuration may refer to a mirror that is driven in one direction by two actuators. The two actuators may be located at opposite ends or sides of the mirror, and the actuators may be driven in a cooperative manner so that when one actuator pushes on the mirror, the other actuator pulls on the mirror, and vice versa. As an example, a mirror may be driven along a horizontal or vertical direction by two voice coil actuators arranged in a push-pull configuration. In particular embodiments, a scanner 120 may include one mirror configured to be scanned along two axes, where motion along each axis is provided by two actuators arranged in a push-pull configuration. As an example, a mirror may be driven along a horizontal direction by two resonant actuators arranged in a horizontal push-pull configuration, and the mirror may be driven along a vertical direction by another two resonant actuators arranged in a vertical push-pull configuration.

In particular embodiments, a scanner 120 may include two mirrors which are driven synchronously so that the output beam 125 is directed along any suitable scan pattern 200. As an example, a galvanometer actuator may drive mirror 301 with a substantially linear back-and-forth motion (e.g., the galvanometer may be driven with a substantially sinusoidal or triangle-shaped waveform) that causes output beam 125 to trace a substantially horizontal back-and-forth pattern. Additionally, another galvanometer actuator may scan mirror 302 along a substantially vertical direction. For example, the two galvanometers may be synchronized so that for every 64 horizontal traces, the output beam 125 makes a single trace along a vertical direction. As another example, a resonant actuator may drive mirror 301 along a substantially horizontal direction, and a galvanometer actuator or a resonant actuator may scan mirror 302 along a substantially vertical direction.

In particular embodiments, a scanner 120 may include one mirror driven by two or more actuators, where the actuators are driven synchronously so that the output beam 125 is directed along a particular scan pattern 200. As an example, one mirror may be driven synchronously along two substantially orthogonal directions so that the output beam 125 follows a scan pattern 200 that includes substantially straight lines. In particular embodiments, a scanner 120 may include two mirrors driven synchronously so that the synchronously driven mirrors trace out a scan pattern 200 that includes substantially straight lines. As an example, the scan pattern 200 may include a series of substantially straight lines directed substantially horizontally, vertically, or along any other suitable direction. The straight lines may be achieved by applying a dynamically adjusted deflection along a vertical direction (e.g., with a galvanometer actuator) as an output beam 125 is scanned along a substantially horizontal direction (e.g., with a galvanometer or resonant actuator). If a vertical deflection is not applied, the output beam 125 may trace out a curved path as it scans from side to side. By applying a vertical deflection as the mirror is scanned horizontally, a scan pattern 200 that includes substantially straight lines may be achieved. In particular embodiments, a vertical actuator may be used to apply both a dynamically adjusted vertical deflection as the output beam 125 is scanned horizontally as well as a discrete vertical offset between each horizontal scan (e.g., to step the output beam 125 to a subsequent row of a scan pattern 200).

In the example of FIG. 3, lidar system 100 produces an output beam 125 and receives light from an input beam 135. The output beam 125, which includes at least a portion of the pulses of light emitted by light source 110, may be scanned across a field of regard. The input beam 135 may include at least a portion of the scanned pulses of light which are scattered by one or more targets 130 and detected by receiver 140. In particular embodiments, output beam 125 and input beam 135 may be substantially coaxial. The input and output beams being substantially coaxial may refer to the beams being at least partially overlapped or sharing a common propagation axis so that input beam 135 and output beam 125 travel along substantially the same optical path (albeit in opposite directions). As output beam 125 is scanned across a field of regard, the input beam 135 may follow along with the output beam 125 so that the coaxial relationship between the two beams is maintained.

In particular embodiments, a lidar system 100 may include an overlap mirror 115 configured to overlap the input beam 135 and output beam 125 so that they are substantially coaxial. In FIG. 3, the overlap mirror 115 includes a hole, slot, or aperture 310 which the output beam 125 passes through and a reflecting surface 320 that reflects at least a portion of the input beam 135 toward the receiver 140. The overlap mirror 115 may be oriented so that input beam 135 and output beam 125 are at least partially overlapped. In particular embodiments, input beam 135 may pass through a lens 330 which focuses the beam onto an APD 400 of the receiver 140. The active region of the APD 400 may refer to an area over which receiver 140 may receive or detect input light. The active region may have any suitable size or diameter d, such as for example, a diameter of approximately 25 µm, 50 µm, 80 µm, 100 µm, 200 µm, 500 µm, 1 mm, 2 mm, or 5 mm. In particular embodiments, overlap mirror 115 may have a reflecting surface 320 that is substantially flat or the reflecting surface 320 may be curved (e.g., mirror 115 may be an off-axis parabolic mirror configured to focus the input beam 135 onto an active region of the receiver 140). A reflecting surface 320 (which may be referred to as a reflective surface 320) may include a reflective metallic coating (e.g., gold, silver, or aluminum) or a reflective dielectric coating, and the reflecting surface 320 may have any suitable reflectivity R at an operating wavelength of the light source 110 (e.g., R greater than or equal to 70%, 80%, 90%, 95%, 98%, or 99%).

In particular embodiments, aperture 310 may have any suitable size or diameter $\Phi_1$, and input beam 135 may have any suitable size or diameter $\Phi_2$, where $\Phi_2$ is greater than $\Phi_1$. As an example, aperture 310 may have a diameter $\Phi_1$ of approximately 0.2 mm, 0.5 mm, 1 mm, 2 mm, 3 mm, 5 mm, or 10 mm, and input beam 135 may have a diameter $\Phi_2$ of approximately 2 mm, 5 mm, 10 mm, 15 mm, 20 mm, 30 mm, 40 mm, or 50 mm. In particular embodiments, reflective surface 320 of overlap mirror 115 may reflect greater than or equal to 70% of input beam 135 toward the receiver 140. As an example, if reflective surface 320 has a reflectivity R at an operating wavelength of the light source 110, then the fraction of input beam 135 directed toward the receiver 140 may be expressed as $R \times [1-(\Phi_1/\Phi_2)^2]$. For example, if R is 95%, $\Phi_1$ is 2 mm, and $\Phi_2$ is 10 mm, then approximately 91% of input beam 135 may be directed toward the receiver 140 by reflective surface 320.

Figure 4:
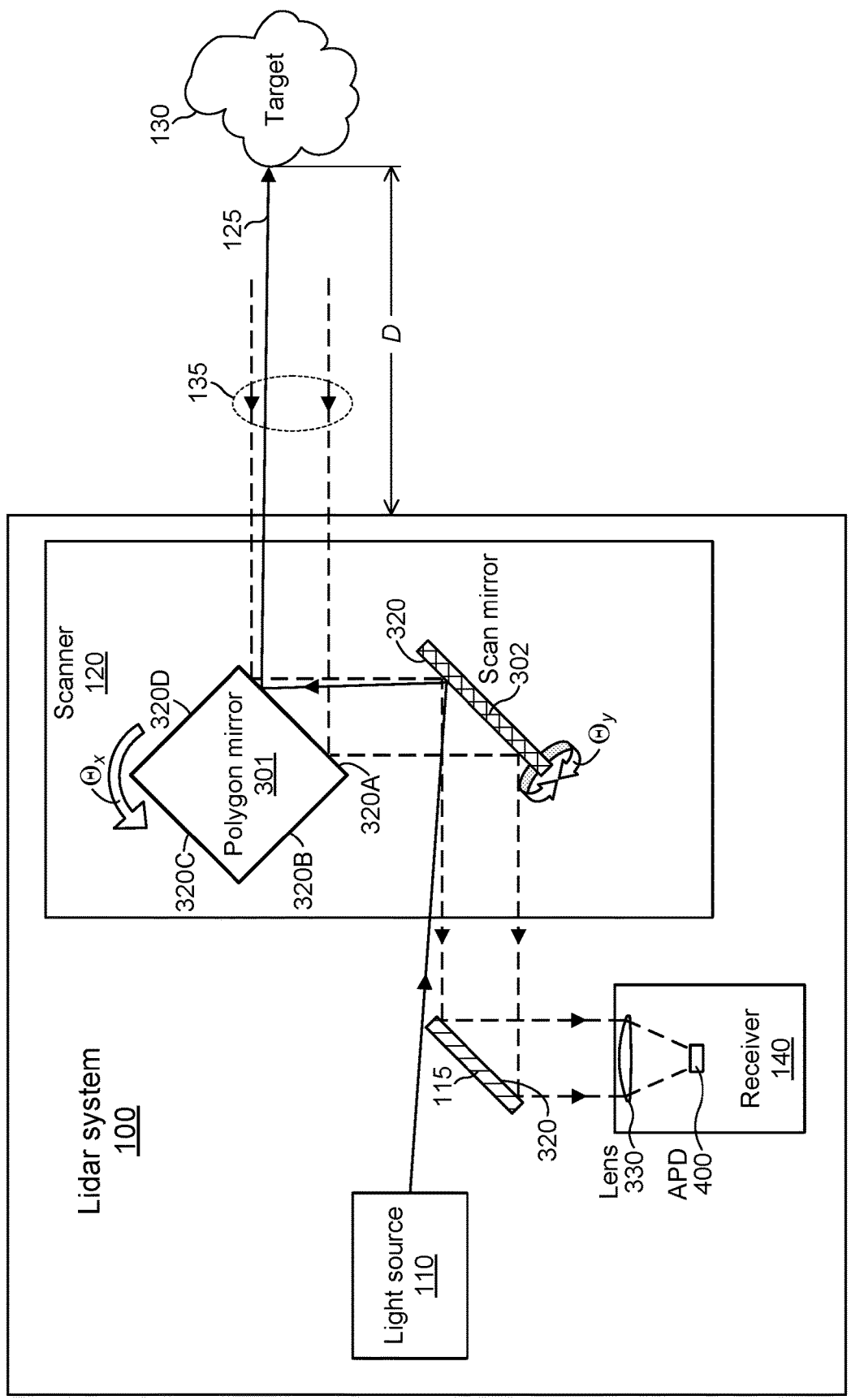
FIG. 4 illustrates an example lidar system with an example rotating polygon mirror.

FIG. 4 illustrates an example lidar system 100 with an example rotating polygon mirror 301. In particular embodiments, a scanner 120 may include a polygon mirror 301 configured to scan output beam 125 along a particular direction. In the example of FIG. 4, scanner 120 includes two scanning mirrors: (1) a polygon mirror 301 that rotates along the $\Theta_x$ direction and (2) a scanning mirror 302 that oscillates back and forth along the $\Theta_y$ direction. The output beam 125 from light source 110, which passes alongside mirror 115, is reflected by reflecting surface 320 of scan mirror 302 and then is reflected by a reflecting surface (e.g., surface 320A, 320B, 320C, or 320D) of polygon mirror 301. Scattered light from a target 130 returns to the lidar system 100 as input beam 135. The input beam 135 reflects from polygon mirror 301, scan mirror 302, and mirror 115, which directs input beam 135 to receiver 140.

In particular embodiments, a polygon mirror 301 may be configured to rotate along a $\Theta_x$ or $\Theta_y$ direction and scan output beam 125 along a substantially horizontal or vertical direction, respectively. A rotation along a $\Theta_x$ direction may refer to a rotational motion of mirror 301 that results in output beam 125 scanning along a substantially horizontal direction. Similarly, a rotation along a $\Theta_y$ direction may refer to a rotational motion that results in output beam 125 scanning along a substantially vertical direction. In FIG. 4, mirror 301 is a polygon mirror that rotates along the $\Theta_x$ direction and scans output beam 125 along a substantially horizontal direction, and mirror 302 rotates along the $\Theta_y$ direction and scans output beam 125 along a substantially vertical direction. In particular embodiments, a polygon mirror 301 may be configured to scan output beam 125 along any suitable direction. As an example, a polygon mirror 301 may scan output beam 125 at any suitable angle with respect to a horizontal or vertical direction, such as for example, at an angle of approximately 0°, 10°, 20°, 30°, 45°, 60°, 70°, 80°, or 90° with respect to a horizontal or vertical direction.

In particular embodiments, a polygon mirror 301 may refer to a multi-sided object having reflective surfaces 320 on two or more of its sides or faces. As an example, a polygon mirror may include any suitable number of reflective faces (e.g., 2, 3, 4, 5, 6, 7, 8, or 10 faces), where each face includes a reflective surface 320. A polygon mirror 301 may have a cross-sectional shape of any suitable polygon, such as for example, a triangle (with three reflecting surfaces 320), square (with four reflecting surfaces 320), pentagon (with five reflecting surfaces 320), hexagon (with six reflecting surfaces 320), heptagon (with seven reflecting surfaces 320), or octagon (with eight reflecting surfaces 320). In FIG. 4, the polygon mirror 301 has a substantially square cross-sectional shape and four reflecting surfaces (320A, 320B, 320C, and 320D). The polygon mirror 301 in FIG. 4 may be referred to as a square mirror, a cube mirror, or a four-sided polygon mirror. In FIG. 4, the polygon mirror 301 may have a shape similar to a cube, cuboid, or rectangular prism. Additionally, the polygon mirror 301 may have a total of six sides, where four of the sides are faces with reflective surfaces (320A, 320B, 320C, and 320D).

In particular embodiments, a polygon mirror 301 may be continuously rotated in a clockwise or counter-clockwise rotation direction about a rotation axis of the polygon mirror 301. The rotation axis may correspond to a line that is perpendicular to the plane of rotation of the polygon mirror 301 and that passes through the center of mass of the polygon mirror 301. In FIG. 4, the polygon mirror 301 rotates in the plane of the drawing, and the rotation axis of the polygon mirror 301 is perpendicular to the plane of the drawing. An electric motor may be configured to rotate a polygon mirror 301 at a substantially fixed frequency (e.g., a rotational frequency of approximately 1 Hz (or 1 revolution per second), 10 Hz, 50 Hz, 100 Hz, 500 Hz, or 1,000 Hz). As an example, a polygon mirror 301 may be mechanically coupled to an electric motor (e.g., a brushless DC motor or a synchronous electric motor) which is configured to spin the polygon mirror 301 at a rotational speed of approximately 160 Hz (or, 9600 revolutions per minute (RPM)).

In particular embodiments, output beam 125 may be reflected sequentially from the reflective surfaces (320A, 320B, 320C, and 320D) as the polygon mirror 301 is rotated. This results in the output beam 125 being scanned along a particular scan axis (e.g., a horizontal or vertical scan axis) to produce a sequence of scan lines, where each scan line corresponds to a reflection of the output beam 125 from one of the reflective surfaces of the polygon mirror 301. In FIG. 4, the output beam 125 reflects off of reflective surface 320A to produce one scan line. Then, as the polygon mirror 301 rotates, the output beam 125 reflects off of reflective surfaces 320B, 320C, and 320D to produce a second, third, and fourth respective scan line.

In particular embodiments, output beam 125 may be directed to pass by a side of mirror 115 rather than passing through mirror 115. As an example, mirror 115 may not include an aperture 310, and the output beam 125 may be directed to pass along a side of mirror 115. In the example of FIG. 3, lidar system includes an overlap mirror 115 with an aperture 310 that output beam 125 passes through. In the example of FIG. 4, output beam 125 from light source 110 is directed to pass by mirror 115 (which does not include an aperture) and then to scan mirror 302.

Figure 5:
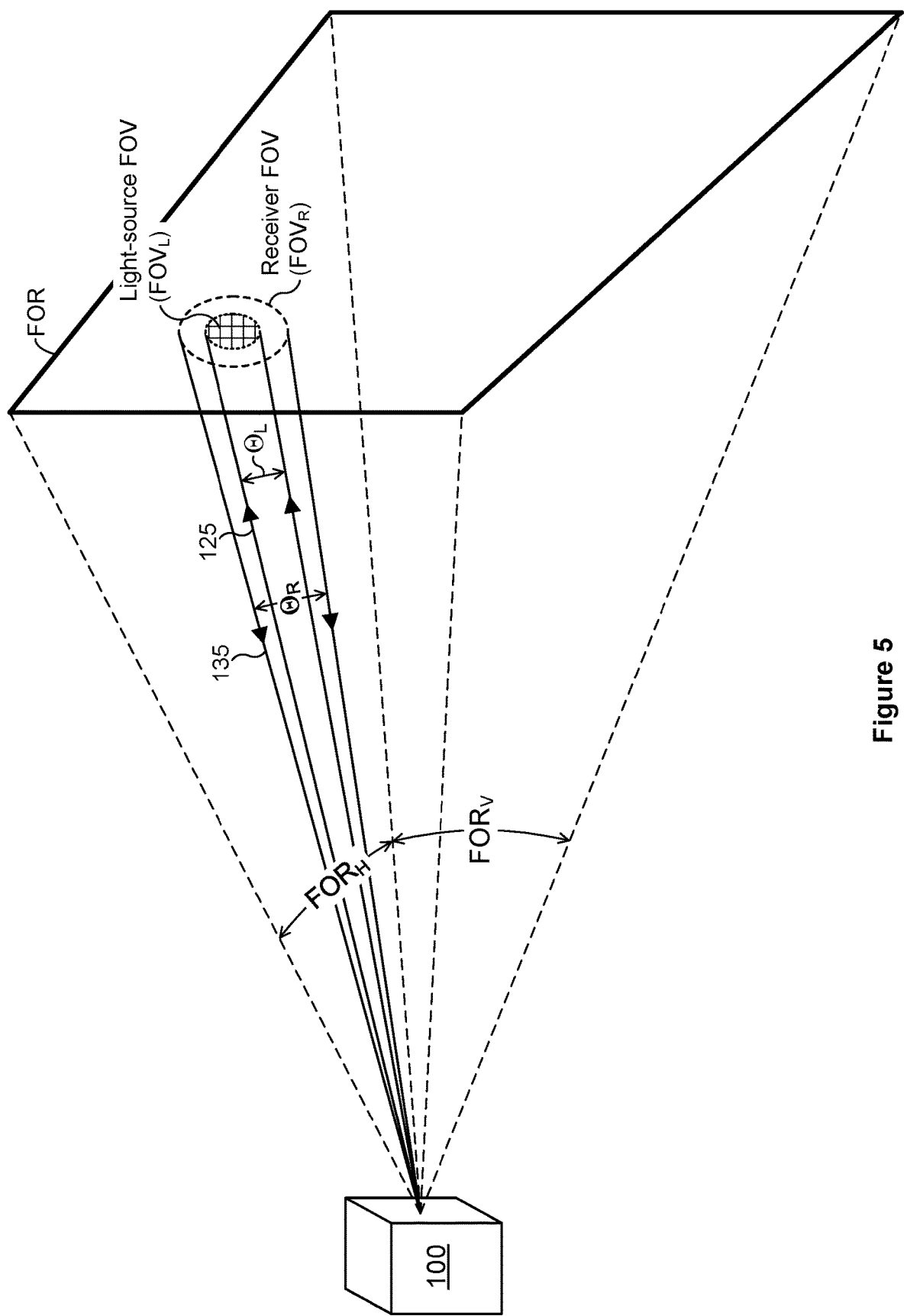
FIG. 5 illustrates an example light-source field of view and receiver field of view for a lidar system.

FIG. 5 illustrates an example light-source field of view ($FOV_L$) and receiver field of view ($FOV_R$) for a lidar system 100. A light source 110 of lidar system 100 may emit pulses of light as the $FOV_L$ and $FOV_R$ are scanned by scanner 120 across a field of regard (FOR). In particular embodiments, a light-source field of view may refer to an angular cone illuminated by the light source 110 at a particular instant of time. Similarly, a receiver field of view may refer to an angular cone over which the receiver 140 may receive or detect light at a particular instant of time, and any light outside the receiver field of view may not be received or detected. As an example, as the light-source field of view is scanned across a field of regard, a portion of a pulse of light emitted by the light source 110 may be sent downrange from lidar system 100, and the pulse of light may be sent in the direction that the $FOV_L$ is pointing at the time the pulse is emitted. The pulse of light may scatter off a target 130, and the receiver 140 may receive and detect a portion of the scattered light that is directed along or contained within the $FOV_R$.

In particular embodiments, scanner 120 may be configured to scan both a light-source field of view and a receiver field of view across a field of regard of the lidar system 100. Multiple pulses of light may be emitted and detected as the scanner 120 scans the $FOV_L$ and $FOV_R$ across the field of regard of the lidar system 100 while tracing out a scan pattern 200. In particular embodiments, the light-source field of view and the receiver field of view may be scanned synchronously with respect to one another, so that as the $FOV_L$ is scanned across a scan pattern 200, the $FOV_R$ follows substantially the same path at the same scanning speed (e.g., the $FOV_L$ and $FOV_R$ may scan along a scan line at a scanning speed of approximately 10 degrees/s, 100 degrees/s, 1 degree/ms, 10 degrees/ms, or 100 degrees/ms). Additionally, the $FOV_L$ and $FOV_R$ may maintain the same relative position to one another as they are scanned across the field of regard. As an example, the $FOV_L$ may be substantially overlapped with or centered inside the $FOV_R$ (as illustrated in FIG. 5), and this relative positioning between $FOV_L$ and $FOV_R$ may be maintained throughout a scan. As another example, the $FOV_R$ may lag behind the $FOV_L$ by a particular, fixed amount throughout a scan (e.g., the $FOV_R$ may be offset from the $FOV_L$ in a direction opposite the scan direction).

In particular embodiments, the $FOV_L$ may have an angular size or extent $\Theta_L$ that is substantially the same as or that corresponds to the divergence of the output beam 125, and the $FOV_R$ may have an angular size or extent $\Theta_R$ that corresponds to an angle over which the receiver 140 may receive and detect light. In particular embodiments, the receiver field of view may be any suitable size relative to the light-source field of view. As an example, the receiver field of view may be smaller than, substantially the same size as, or larger than the angular extent of the light-source field of view. In particular embodiments, the light-source field of view may have an angular extent of less than or equal to 50 milliradians, and the receiver field of view may have an angular extent of less than or equal to 50 milliradians. The $FOV_L$ may have any suitable angular extent $\Theta_L$, such as for example, approximately 0.1 mrad, 0.2 mrad, 0.5 mrad, 1 mrad, 1.5 mrad, 2 mrad, 3 mrad, 5 mrad, 10 mrad, 20 mrad, 40 mrad, or 50 mrad. Similarly, the $FOV_R$ may have any suitable angular extent $\Theta_R$, such as for example, approximately 0.1 mrad, 0.2 mrad, 0.5 mrad, 1 mrad, 1.5 mrad, 2 mrad, 3 mrad, 5 mrad, 10 mrad, 20 mrad, 40 mrad, or 50 mrad. In particular embodiments, the light-source field of view and the receiver field of view may have approximately equal angular extents. As an example, $\Theta_L$ and $\Theta_R$ may both be approximately equal to 1 mrad, 2 mrad, or 4 mrad. In particular embodiments, the receiver field of view may be larger than the light-source field of view, or the light-source field of view may be larger than the receiver field of view. As an example, $\Theta_L$ may be approximately equal to 3 mrad, and $\Theta_R$ may be approximately equal to 4 mrad. As another example, $\Theta_R$ may be approximately L times larger than $\Theta_L$, where L is any suitable factor, such as for example, 1.1, 1.2, 1.5, 2, 3, 5, or 10.

In particular embodiments, a pixel 210 may represent or may correspond to a light-source field of view or a receiver field of view. As the output beam 125 propagates from the light source 110, the diameter of the output beam 125 (as well as the size of the corresponding pixel 210) may increase according to the beam divergence $\Theta_L$. As an example, if the output beam 125 has a $\Theta_L$ of 2 mrad, then at a distance of 100 m from the lidar system 100, the output beam 125 may have a size or diameter of approximately 20 cm, and a corresponding pixel 210 may also have a corresponding size or diameter of approximately 20 cm. At a distance of 200 m from the lidar system 100, the output beam 125 and the corresponding pixel 210 may each have a diameter of approximately 40 cm.

Figure 6:
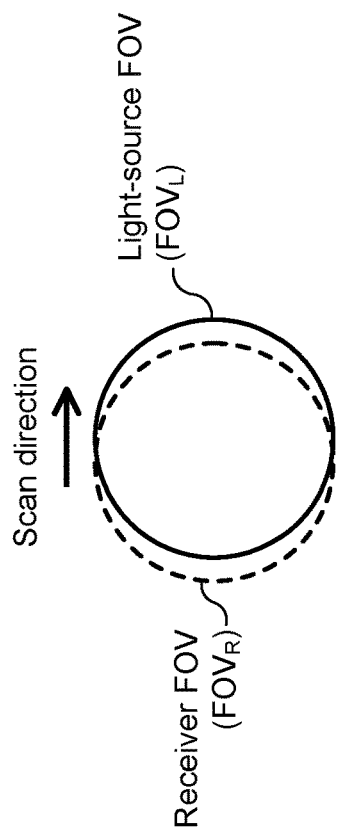
FIG. 6 illustrates an example light-source field of view and receiver field of view with a corresponding scan direction.

FIG. 6 illustrates an example light-source field of view and receiver field of view with a corresponding scan direction. In particular embodiments, scanner 120 may scan the $FOV_L$ and $FOV_R$ along any suitable scan direction or combination of scan directions, such as for example, left to right, right to left, upward, downward, or any suitable combination thereof. As an example, the $FOV_L$ and $FOV_R$ may follow a left-to-right scan direction (as illustrated in FIG. 6) across a field of regard, and then the $FOV_L$ and $FOV_R$ may travel back across the field of regard in a right-to-left scan direction. In particular embodiments, a light-source field of view and a receiver field of view may be non-overlapped during scanning or may be at least partially overlapped during scanning. As an example, the $FOV_L$ and $FOV_R$ may have any suitable amount of angular overlap, such as for example, approximately 0%, 1%, 2%, 5%, 10%, 25%, 50%, 75%, 90%, or 100% of angular overlap. As another example, if $\Theta_L$ and $\Theta_R$ are 2 mrad, and $FOV_L$ and $FOV_R$ are offset from one another by 1 mrad, then $FOV_L$ and $FOV_R$ may be referred to as having a 50% angular overlap. As another example, if $\Theta_L$ and $\Theta_R$ are 2 mrad, and $FOV_L$ and $FOV_R$ are offset from one another by 2 mrad, then $FOV_L$ and $FOV_R$ may be referred to as having a 0% angular overlap. As another example, the $FOV_L$ and $FOV_R$ may be substantially coincident with one another and may have an angular overlap of approximately 100%. In the example of FIG. 6, the $FOV_L$ and $FOV_R$ are approximately the same size and have an angular overlap of approximately 90%.

Figure 7:
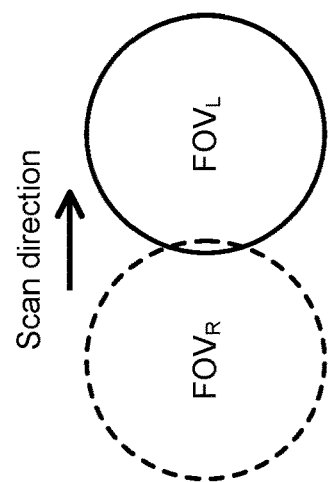
FIG. 7 illustrates an example receiver field of view that is offset from a light-source field of view.

FIG. 7 illustrates an example receiver field of view that is offset from a light-source field of view. In particular embodiments, a $FOV_L$ and $FOV_R$ may be scanned along a particular scan direction, and the $FOV_R$ may be offset from the $FOV_L$ in a direction opposite the scan direction. A lidar system with a polygon mirror (e.g., similar to that illustrated in FIG. 4) may have its $FOV_L$ and $FOV_R$ arranged as illustrated in FIG. 7 where the $FOV_R$ lags behind the $FOV_L$. Each reflection of the output beam 125 from a reflective surface of polygon mirror 301 may correspond to a single scan line, and each scan line may scan across a FOR in the same direction (e.g., from left to right).

In the example of FIG. 7, the $FOV_L$ and $FOV_R$ are approximately the same size, and the $FOV_R$ lags behind the $FOV_L$ so that the $FOV_L$ and $FOV_R$ have an angular overlap of approximately 5%. In particular embodiments, the $FOV_R$ may be configured to lag behind the $FOV_L$ to produce any suitable angular overlap, such as for example, an angular overlap of less than or equal to 50%, 25%, 5%, 1%, or 0%. After a pulse of light is emitted by light source 110, the pulse may scatter from a target 130, and some of the scattered light may propagate back to the lidar system 100 along a path that corresponds to the orientation of the light-source field of view at the time the pulse was emitted. As the pulse of light propagates to and from the target 130, the receiver field of view moves in the scan direction and increases its overlap with the previous location of the light-source field of view (e.g., the location of the light-source field of view when the pulse was emitted). For a close-range target (e.g., a target 130 located within 20% of the maximum range of the lidar system), when the receiver 140 detects scattered light from the emitted pulse, the receiver field of view may overlap less than or equal to 20% of the previous location of the light-source field of view. The receiver 140 may receive less than or equal to 20% of the scattered light that propagates back to the lidar system 100 along the path that corresponds to the orientation of the light-source field of view at the time the pulse was emitted. However, since the target 130 is located relatively close to the lidar system 100, the receiver 140 may still receive a sufficient amount of light to produce a signal indicating that a pulse has been detected. For a midrange target (e.g., a target 130 located between 20% and 80% of the maximum range of the lidar system 100), when the receiver 140 detects the scattered light, the receiver field of view may overlap between 20% and 80% of the previous location of the light-source field of view. For a target 130 located a distance greater than or equal to 80% of the maximum range of the lidar system 100, when the receiver 140 detects the scattered light, the receiver field of view may overlap greater than or equal to 80% of the previous location of the light-source field of view. For a target 130 located at the maximum range from the lidar system 100, when the receiver 140 detects the scattered light, the receiver field of view may be substantially overlapped with the previous location of the light-source field of view, and the receiver 140 may receive substantially all of the scattered light that propagates back to the lidar system 100.

Figure 8:
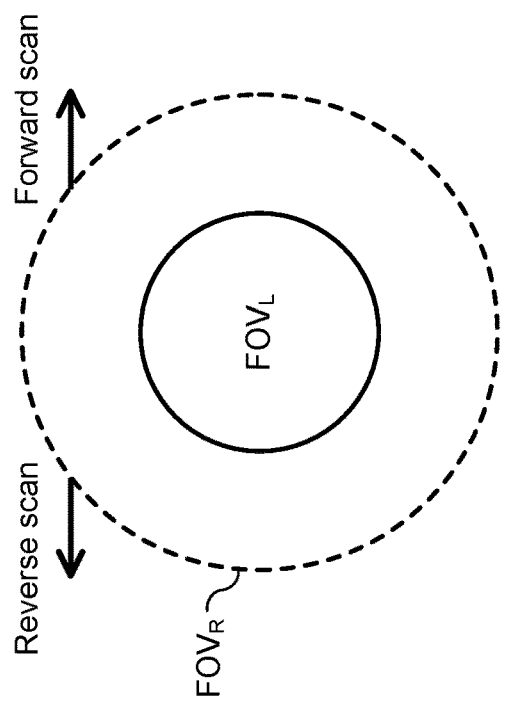
FIG. 8 illustrates an example forward-scan direction and reverse-scan direction for a light-source field of view and a receiver field of view.

FIG. 8 illustrates an example forward-scan direction and reverse-scan direction for a light-source field of view and a receiver field of view. In particular embodiments, a lidar system 100 may be configured so that the $FOV_R$ is larger than the $FOV_L$, and the receiver and light-source FOVs may be substantially coincident, overlapped, or centered with respect to one another. As an example, the $FOV_R$ may have a diameter or angular extent $\Theta_R$, that is approximately 1.5×, 2×, 3×, 4×, 5×, or 10× larger than the diameter or angular extent $\Theta_L$ of the $FOV_L$. In the example of FIG. 8, the diameter of the receiver field of view is approximately 2 times larger than the diameter of the light-source field of view, and the two FOVs are overlapped and centered with respect to one another. The receiver field of view being larger than the light-source field of view may allow the receiver 140 to receive scattered light from emitted pulses in both scan directions (forward scan or reverse scan). In the forward-scan direction illustrated in FIG. 8, scattered light may be received primarily by the left side of the $FOV_R$, and in the reverse-scan direction, scattered light may be received primarily by the right side of the $FOV_R$. For example, as a pulse of light propagates to and from a target 130 during a forward scan, the $FOV_R$ scans to the right, and scattered light that returns to the lidar system 100 may be received primarily by the left portion of the $FOV_R$.

In particular embodiments, a lidar system 100 may perform a series of forward and reverse scans. As an example, a forward scan may include the $FOV_L$ and the $FOV_R$ being scanned horizontally from left to right, and a reverse scan may include the two fields of view being scanned from right to left. As another example, a forward scan may include the $FOV_L$ and the $FOV_R$ being scanned along any suitable direction (e.g., along a 45-degree angle), and a reverse scan may include the two fields of view being scanned along a substantially opposite direction. In particular embodiments, the forward and reverse scans may trace paths that are adjacent to or displaced with respect to one another. As an example, a reverse scan may follow a line in the field of regard that is displaced above, below, to the left of, or to the right of a previous forward scan. As another example, a reverse scan may scan a row in the field of regard that is displaced below a previous forward scan, and the next forward scan may be displaced below the reverse scan. The forward and reverse scans may continue in an alternating manner with each scan being displaced with respect to the previous scan until a complete field of regard has been covered. Scans may be displaced with respect to one another by any suitable angular amount, such as for example, by approximately 0.05°, 0.1°, 0.2°, 0.5°, 1°, or 2°.

Figure 9:
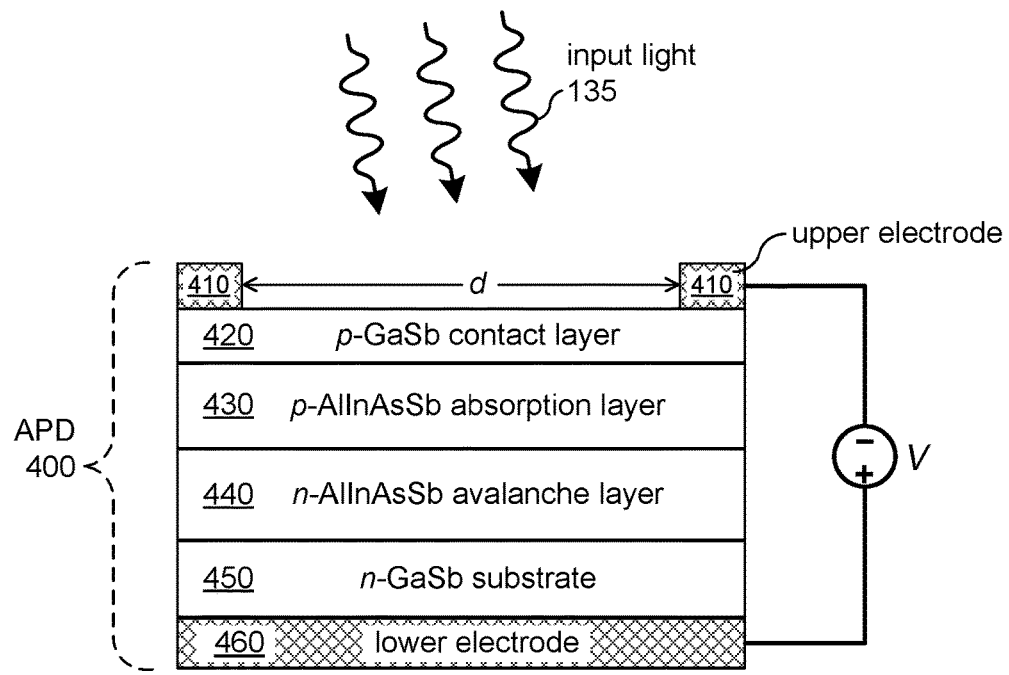
FIG. 9 illustrates an example aluminum-indium-arsenide-antimonide (AlInAsSb) avalanche photodiode (APD) 400.

FIG. 9 illustrates an example aluminum-indium-arsenide-antimonide (AlInAsSb) avalanche photodiode (APD) 400. In particular embodiments, a receiver 140 may include one or more AlInAsSb APDs 400 configured to receive and detect light from an input beam 135. An APD 400 may be configured to detect a portion of pulses of light which are emitted by light source 110 and then scattered by a target 130 located downrange from lidar system 100. As an example, an APD 400 may receive a portion of an emitted pulse of light which is scattered by a target 130, and the APD 400 may produce an electrical-current signal (e.g., a pulse of electrical current) corresponding to the received pulse of light.

In particular embodiments, an APD 400 may include doped or undoped layers of any suitable semiconductor material, such as for example, AlInAsSb, silicon, germanium, InGaAs, InGaAsP, gallium antimonide (GaSb), or indium phosphide (InP). The APD 400 in FIG. 9 includes two layers of the semiconductor material AlInAsSb, and the composition of each layer may be expressed in the form $Al_xIn_{1-x}As_ySb_{1-y}$, where x and y are each a value from 0 to 1 corresponding to the relative amounts of aluminum (Al), indium (In), arsenic (As), or antimony (Sb). For example, the absorption layer 430 may include AlInAsSb material with the composition $Al_{0.4}In_{0.6}As_{0.3}Sb_{0.7}$, and the avalanche layer 440 may include material with the composition $Al_{0.8}In_{0.2}As_{0.3}Sb_{0.7}$.

In particular embodiments, an AlInAsSb APD 400 may include an upper electrode 410 and a lower electrode 460 for coupling the ADP 400 to an electrical circuit. As an example, the APD 400 may be electrically coupled to a voltage source that supplies a reverse-bias voltage V to the APD 400. Additionally, the APD 400 may be electrically coupled to a transimpedance amplifier which receives electrical current generated by the APD 400 and produces an output voltage signal that corresponds to the received current. The upper electrode 410 or lower electrode 460 may include any suitable electrically conductive material, such as for example a metal (e.g., gold, copper, silver, or aluminum), a transparent conductive oxide (e.g., indium tin oxide), a carbon-nanotube material, a highly doped semiconductor material, or polysilicon. In particular embodiments, the upper electrode 410 may be partially transparent or may have an opening to allow input light 135 to pass through to the active region of the APD 400. In FIG. 9, the upper electrode 410 may have a ring shape that at least partially surrounds the active region of the APD, where the active region refers to an area over which the APD 400 may receive and detect input light 135. The active region may have any suitable size or diameter d, such as for example, a diameter of approximately 25 μm, 50 μm, 80 μm, 100 μm, 200 μm, 500 μm, 1 mm, 2 mm, or 5 mm.

In particular embodiments, an AlInAsSb APD 400 may include any suitable combination of any suitable semiconductor layers having any suitable doping (e.g., n-doped, p-doped, or intrinsic undoped material). An AlInAsSb APD 400 may include a contact layer that includes GaSb or InP, and the AlInAsSb APD 400 may be grown on a GaSb or InP substrate. In FIG. 9, the contact layer 420 includes p-doped GaSb, and the substrate 450 includes n-doped GaSb. Additionally, the AlInAsSb APD 400 in FIG. 9 includes a p-doped AlInAsSb absorption layer 430 and an n-doped AlInAsSb avalanche layer 440 (which may be referred to as a multiplication layer or multiplication region). An AlInAsSb APD 400 may include one or more additional layers not illustrated in FIG. 9, such as for example, a blocking layer, a graded-bandgap layer, a charge layer, or an additional contact layer. In particular embodiments, an AlInAsSb APD 400 may include separate absorption and avalanche layers, or a single layer may act as both an absorption and avalanche region. An AlInAsSb APD 400 may operate electrically as a PN diode or a PIN diode, and during operation, the APD 400 may be reverse biased with a positive voltage V applied to the lower electrode 460 with respect to the upper electrode 410. The applied reverse-bias voltage V may have any suitable value, such as for example approximately 10 V, 20 V, 30 V, 50 V, 75 V, 100 V, or 200 V. As an example, a 40-V to 50-V reverse-bias voltage may be applied to an AlInAsSb APD 400.

In FIG. 9, photons of input light 135 may be absorbed primarily in the absorption layer 430, resulting in the generation of electrons or holes (which may be referred to as photo-generated carriers). As an example, the absorption layer 430 may be configured to absorb photons corresponding to the operating wavelength of the lidar system 100 (e.g., any suitable wavelength between approximately 1400 nm and approximately 1600 nm). In particular embodiments, an AlInAsSb APD 400 may be configured to detect light having any suitable wavelength between 900 nm and 2000 nm. As an example, an AlInAsSb APD 400 may detect light at approximately 905 nm, 1100 nm, 1400 nm, 1500 nm, 1550 nm, 1600 nm, 1700 nm, or 2000 nm. As another example, an AlInAsSb APD 400 may detect light any one or more wavelengths between approximately 900 nm and approximately 1700 nm. In the avalanche layer 440, an avalanche-multiplication process occurs where photo-generated carriers (e.g., electrons or holes) produced in the absorption layer 430 collide with the semiconductor lattice of the avalanche layer 440 and produce additional carriers through impact ionization. This avalanche process can repeat numerous times so that one photo-generated carrier may result in the generation of multiple carriers. As an example, a single photon absorbed in the absorption layer 430 may lead to the generation of approximately 10, 50, 100, 200, 500, 1000, 10,000, or any other suitable number of electrons through an avalanche-multiplication process. The number of carriers generated from a single photo-generated carrier may be referred to as the gain of the APD 400. For example, the gain of an AlInAsSb APD 400 may be greater than or equal to 10, 20, 30, 40, 50, 100, 200, or 500. The carriers generated in an APD 400 may produce an electrical current (which may be referred to as a photocurrent) that is coupled to an electrical circuit which may perform signal amplification, sampling, filtering, signal conditioning, analog-to-digital conversion, time-to-digital conversion, pulse detection, threshold detection, rising-edge detection, or falling-edge detection.

In particular embodiments, the gain of an APD 40 (e.g., the number of carriers generated from a single photo-generated carrier) may increase as the applied reverse bias V is increased. If the applied reverse bias V is increased above a particular value referred to as the APD breakdown voltage, then a single carrier can trigger a self-sustaining avalanche process (e.g., the output of the APD 400 is saturated regardless of the input light level). In particular embodiments, an APD 400 that is operated at or above a breakdown voltage may be referred to as a single-photon avalanche diode (SPAD) and may be referred to as operating in a Geiger mode or a photon-counting mode. An APD 400 operated below a breakdown voltage may be referred to as a linear APD 400 or a linear-mode APD 400, and the output current generated by the APD may be sent to an amplifier circuit (e.g., a transimpedance amplifier). In particular embodiments, receiver 140 may include an APD configured to operate as a SPAD and a quenching circuit configured to reduce a reverse-bias voltage applied to the SPAD when an avalanche event occurs in the SPAD. An APD 400 configured to operate as a SPAD may be coupled to an electronic quenching circuit that reduces the applied voltage V below the breakdown voltage when an avalanche-detection event occurs. Reducing the applied voltage may halt the avalanche process, and the applied reverse-bias voltage may then be re-set to await a subsequent avalanche event. Additionally, the APD 400 may be coupled to a circuit that generates an electrical output pulse or edge when an avalanche event occurs.

In particular embodiments, an AlInAsSb APD 400 or an AlInAsSb APD 400 and a transimpedance amplifier may have a noise-equivalent power (NEP) that is less than or equal to 200 photons, 100 photons, 50 photons, 30 photons, 20 photons, or 10 photons. As an example, an AlInAsSb APD 400 may be operated as a SPAD and may have a NEP of less than or equal to 20 photons. As another example, a linear-mode AlInAsSb APD 400 may be coupled to a transimpedance amplifier that produces an output voltage signal with a NEP of less than or equal to 50 photons. The NEP of an APD 400 is a metric that quantifies the sensitivity of the APD 400 in terms of a minimum signal (or a minimum number of photons) that the APD 400 can detect. In particular embodiments, the NEP may correspond to an optical power (or to a number of photons) within a 1-Hz bandwidth that results in a signal-to-noise ratio of 1, or the NEP may represent a threshold number of photons above which an optical signal may be detected. As an example, if an APD 400 has a NEP of 20 photons, then an input beam 135 with 20 photons may be detected with a signal-to-noise ratio of approximately 1 (e.g., the APD 400 may receive 20 photons from the input beam 135 and generate an electrical signal representing the input beam 135 that has a signal-to-noise ratio of approximately 1). Similarly, an input beam 135 with 100 photons may be detected with a signal-to-noise ratio of approximately 5. In particular embodiments, a lidar system 100 with an AlInAsSb APD 400 (or a combination of an APD 400 and transimpedance amplifier) having a NEP of less than or equal to 200 photons, 100 photons, 50 photons, 30 photons, 20 photons, or 10 photons may offer improved detection sensitivity with respect to a conventional lidar system that uses a PN or PIN photodiode. As an example, an InGaAs PIN photodiode used in a conventional lidar system may have a NEP of approximately $10^4$ to $10^5$ photons, and the noise level in a lidar system with an InGaAs PIN photodiode may be $10^3$ to $10^4$ times greater than the noise level in a lidar system 100 with an AlInAsSb APD 400.

In particular embodiments, an AlInAsSb APD 400 may have an excess noise factor (ENF) of less than 2, 3, 4, 5, or 10. As an example, an AlInAsSb APD 400 may operate with a gain of greater than 10 and an ENF of less than three. Excess noise (which may be referred to as gain noise or multiplication noise) may refer to the noise due to the avalanche multiplication process in the APD 400. The excess noise factor represents the increase in the statistical noise (e.g., shot noise) associated with the avalanche multiplication process in an APD. In other types of APDs (e.g., Si or InGaAs APDs), the ENF typically increases with the gain or the reverse-bias voltage of the APD. In an AlInAsSb APD 400, the ENF may reach a plateau as the gain or reverse-bias voltage is increased, or the ENF may increase at a much lower rate compared to other types of APDs. For example, an InGaAs APD may have an ENF of about 5.5 when operating at a gain of 20, and an AlInAsSb APD 400 may have an ENF of less than 3 when operating at a gain between about 20 and 50. This reduced ENF may allow an AlInAsSb APD 400 to be operated at a higher gain (e.g., a gain of 40 or greater) than other types of APDs without producing significant false alarms associated with noise events.

Figure 10:
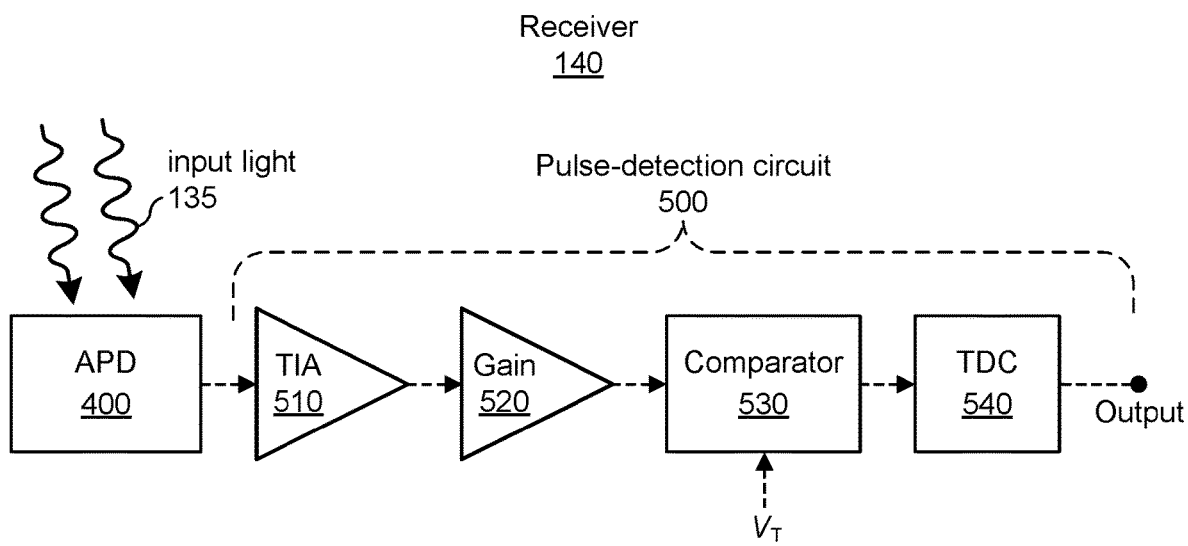
FIG. 10 illustrates an APD coupled to an example pulse-detection circuit.

FIG. 10 illustrates an APD 400 coupled to an example pulse-detection circuit 500. In particular embodiments, a pulse-detection circuit 500 may include circuitry that receives a signal from a detector (e.g., an electrical current from APD 400) and performs current-to-voltage conversion, signal amplification, sampling, filtering, signal conditioning, analog-to-digital conversion, time-to-digital conversion, pulse detection, threshold detection, rising-edge detection, or falling-edge detection. The pulse-detection circuit 500 may determine whether an optical pulse has been received by an APD 400 or may determine a time associated with receipt of an optical pulse by APD 400. In particular embodiments, a pulse-detection circuit 500 may include a transimpedance amplifier (TIA) 510, a gain circuit 520, a comparator 530, or a time-to-digital converter (TDC) 540. In particular embodiments, a pulse-detection circuit 500 may be included in a receiver 140 or a controller 150, or parts of a pulse-detection circuit 500 may be included in a receiver 140 and controller 150. As an example, a TIA 510 and a voltage-gain circuit 520 may be part of a receiver 140, and a comparator 530 and a TDC 540 may be part of a controller 150 that is coupled to the receiver 140.

In particular embodiments, a pulse-detection circuit 500 may include a TIA 510 configured to receive an electrical-current signal from an APD 400 and produce a voltage signal that corresponds to the received electrical-current signal. As an example, in response to a received optical pulse (e.g., light from an emitted pulse that is scattered by a remote target 130), an APD 400 may produce a current pulse corresponding to the optical pulse. A TIA 510 may receive the current pulse from the APD 400 and produce a voltage pulse that corresponds to the received current pulse. In particular embodiments, a TIA 510 may also act as an electronic filter. As an example, a TIA 510 may be configured as a low-pass filter that removes or attenuates high-frequency electrical noise by attenuating signals above a particular frequency (e.g., above 1 MHz, 10 MHz, 20 MHz, 50 MHz, 100 MHz, 200 MHz, or any other suitable frequency). In particular embodiments, a pulse-detection circuit 500 may include a gain circuit 520 configured to amplify a voltage signal. As an example, a gain circuit 520 may include one or more voltage-amplification stages that amplify a voltage signal received from a TIA 510. For example, the gain circuit 520 may receive a voltage pulse from a TIA 510, and the gain circuit 520 may amplify the voltage pulse by any suitable amount, such as for example, by a gain of approximately 3 dB, 10 dB, 20 dB, 30 dB, 40 dB, or 50 dB. Additionally, the gain circuit 520 may also act as an electronic filter configured to remove or attenuate electrical noise. In particular embodiments, a pulse-detection circuit 500 may not include a separate gain circuit 520 (e.g., a TIA 510 may be used to produce an amplified voltage signal), and TIA 510 may be electrically coupled to a comparator 530.

In particular embodiments, a pulse-detection circuit 500 may include a comparator 530 configured to receive a voltage signal from TIA 510 or gain circuit 520 and produce an electrical-edge signal (e.g., a rising edge or a falling edge) when the received voltage signal rises above or falls below a particular threshold voltage $V_T$. As an example, when a received voltage rises above $V_T$, a comparator 530 may produce a rising-edge digital-voltage signal (e.g., a signal that steps from approximately 0 V to approximately 2.5 V, 3.3 V, 5 V, or any other suitable digital-high level). As another example, when a received voltage falls below $V_T$, a comparator 530 may produce a falling-edge digital-voltage signal (e.g., a signal that steps down from approximately 2.5 V, 3.3 V, 5 V, or any other suitable digital-high level to approximately 0 V). The voltage signal received by the comparator 530 may be received from a TIA 510 or gain circuit 520 and may correspond to an electrical-current signal generated by an APD 400. As an example, the voltage signal received by the comparator 530 may include a voltage pulse that corresponds to an electrical-current pulse produced by the APD 400 in response to receiving an optical pulse. The voltage signal received by the comparator 530 may be an analog signal, and an electrical-edge signal produced by the comparator 530 may be a digital signal.

In particular embodiments, a pulse-detection circuit 500 may include a time-to-digital converter (TDC) 540 configured to receive an electrical-edge signal from a comparator 530 and determine an interval of time between emission of a pulse of light by the light source 110 and receipt of the electrical-edge signal. The interval of time may correspond to a round-trip time of flight for an emitted pulse of light to travel from the lidar system 100 to a target 130 and back to the lidar system 100. The portion of the emitted pulse of light that is received by the lidar system 100 (e.g., scattered light from target 130) may be referred to as a received pulse of light. The output of the TDC 540 may be a numerical value that corresponds to the time interval determined by the TDC 540. In particular embodiments, a TDC 540 may have an internal counter or clock with any suitable period, such as for example, 5 ps, 10 ps, 15 ps, 20 ps, 30 ps, 50 ps, 100 ps, 0.5 ns, 1 ns, 2 ns, 5 ns, or 10 ns. As an example, the TDC 540 may have an internal counter or clock with a 20 ps period, and the TDC 540 may determine that an interval of time between emission and receipt of a pulse is equal to 25,000 time periods, which corresponds to a time interval of approximately 0.5 microseconds. The TDC 540 may send the numerical value "25000" to a processor or controller 150 of the lidar system 100. In particular embodiments, a lidar system 100 may include a processor configured to determine a distance from the lidar system 100 to a target 130 based at least in part on an interval of time determined by a TDC 540. As an example, the processor may be an ASIC or FPGA and may be a part of controller 150. The processor may receive a numerical value (e.g., "25000") from the TDC 540, and based on the received value, the processor may determine the distance from the lidar system 100 to a target 130.

In particular embodiments, determining an interval of time between emission and receipt of a pulse of light may be based on determining (1) a time associated with the emission of the pulse by light source 110 or lidar system 100 and (2) a time when scattered light from the pulse is detected by receiver 140. As an example, a TDC 540 may count the number of time periods or clock cycles between an electrical edge associated with emission of a pulse of light and an electrical edge associated with detection of scattered light from the pulse. Determining when scattered light from the pulse is detected by receiver 140 may be based on determining a time for a rising or falling edge (e.g., a rising or falling edge produced by comparator 530) associated with the detected pulse. In particular embodiments, determining a time associated with emission of a pulse of light may be based on an electrical trigger signal. As an example, light source 110 may produce an electrical trigger signal for each pulse of light that is emitted, or an electrical device (e.g., function generator 420 or controller 150) may provide a trigger signal to the light source 110 to initiate the emission of each pulse of light. A trigger signal associated with emission of a pulse may be provided to TDC 540, and a rising edge or falling edge of the trigger signal may correspond to a time when a pulse is emitted. In particular embodiments, a time associated with emission of a pulse may be determined based on an optical trigger signal. As an example, a time associated with the emission of a pulse of light may be determined based at least in part on detection of a portion of light from the emitted pulse of light (prior to the emitted pulse of light exiting the lidar system 100 and propagating to target 130). The portion of light may be detected by a separate detector (e.g., a PIN photodiode or an APD 400) or by the receiver 140. A portion of light from an emitted pulse of light may be scattered or reflected from a surface (e.g., a surface of a beam splitter or window, or a surface of light source 110, mirror 115, or scanner 120) located within lidar system 100. Some of the scattered or reflected light may be received by an APD 400 of receiver 140, and a pulse-detection circuit 500 coupled to the APD 400 may determine that a pulse has been received. The time at which the pulse was received may be associated with the emission time of the pulse. In particular embodiments, receiver 140 may include one APD 400 and one pulse-detection circuit 500 configured to detect a portion of an emitted pulse of light that is scattered or reflected from within the lidar system 100 as well a portion of the pulse of light that is subsequently scattered by a target 130. In particular embodiments, receiver 140 may include two APDs 400 and two pulse-detection circuits 500. One APD 400 and pulse-detection circuit 500 may detect a portion of an emitted pulse of light that is scattered or reflected from within the lidar system 100, and the other APD 400 and pulse-detection circuit 500 may detect a portion of the pulse of light scattered by a target 130.

In particular embodiments, a lidar system 100 may include a processor configured to determine a distance D from the lidar system 100 to a target 130 based at least in part on a round-trip time of flight for a pulse of light emitted by the light source 110 to travel from the lidar system 100 to the target 130 and back to the lidar system 100. In particular embodiments, a round-trip time of flight for a pulse of light may be determined based at least in part on a rising edge or a falling edge associated with the pulse of light detected by receiver 140. As an example, a pulse of light detected by receiver 140 may generate a current pulse in an APD 400, which results in a rising-edge signal produced by a comparator 530 coupled to the APD 400. In particular embodiments, a lidar system 100 may include a TDC 540 configured to determine a time interval between emission of a pulse of light by light source 110 and detection by receiver 140 of at least a portion of the pulse of light scattered by a target 130.

In particular embodiments, a lidar system 100 with a receiver 140 that includes an AlInAsSb APD 400 may exhibit improved performance compared to lidar systems that use other types of APDs (e.g., silicon or InGaAs APDs). As an example, a receiver 140 with an AlInAsSb APD 400 may operate with a higher gain-bandwidth product (e.g., a gain of greater than 20, 30, 40, or 50 and a bandwidth of greater than 10 MHz, 50 MHz, 100 MHz, or 1 GHz) than a receiver with a different type of APD. The reduced ENF provided by an AlInAsSb APD 400 may allow the AlInAsSb APD 400 to be operated at a higher gain. This increased front-end gain may reduce the gain required in the electrical-amplifier stages that follow the APD (e.g., the TIA 510 or gain circuit 520) or may allow the electrical-amplifier stages to be operated at a higher bandwidth. Additionally, a receiver 140 with an AlInAsSb APD 400 may operate with a lower NEP (e.g., a NEP of less than 30 photons) than a receiver with a different type of APD. The increased sensitivity provided by an AlInAsSb APD 400 (e.g., as represented by a higher gain, higher bandwidth, or lower NEP) may allow a lidar system 100 to operate with emitted pulses that have lower energy than a lidar system with a different type of APD. For example, a light source 110 of a lidar system 100 with an AlInAsSb APD 400 may emit pulses of light having a pulse energy of less than or equal to 1 µJ (e.g., a pulse energy of approximately 1 nJ, 10 nJ, 100 nJ, 200 nJ, 500 nJ, or 1 µJ). Additionally, instead of using a fiber laser (e.g., a seed laser diode followed by an optical amplifier) to produce the pulses of light, a lidar system 100 may operate with a direct-emitter laser diode (e.g., a laser diode that directly emits the emitted pulses of light without an optical amplifier).

Figure 11:
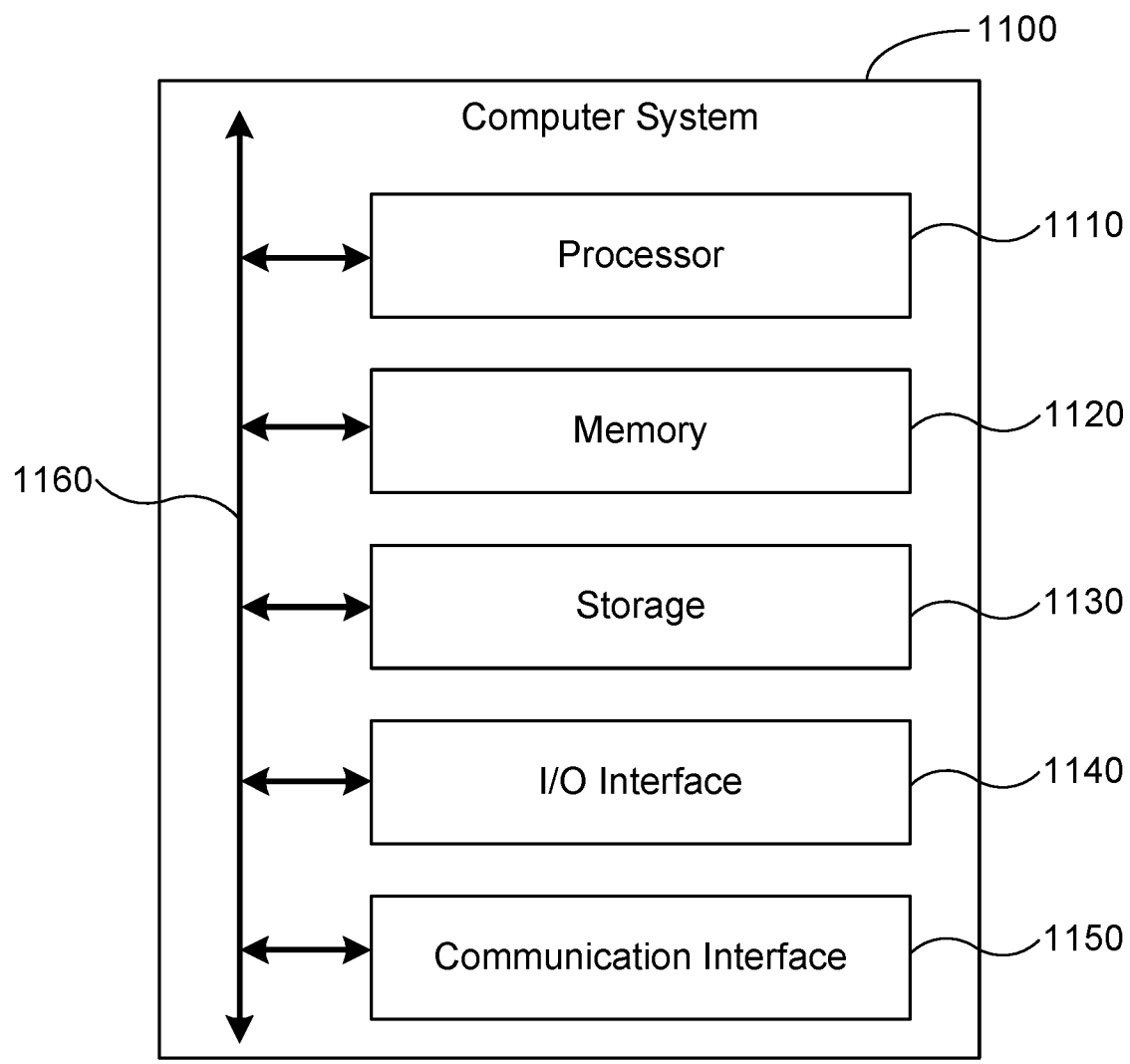
FIG. 11 illustrates an example computer system.

FIG. 11 illustrates an example computer system 1100. In particular embodiments, one or more computer systems 1100 may perform one or more steps of one or more methods described or illustrated herein. In particular embodiments, one or more computer systems 1100 may provide functionality described or illustrated herein. In particular embodiments, software running on one or more computer systems 1100 may perform one or more steps of one or more methods described or illustrated herein or may provide functionality described or illustrated herein. Particular embodiments may include one or more portions of one or more computer systems 1100. In particular embodiments, a computer system may be referred to as a processor, a controller, a computing device, a computing system, a computer, a general-purpose computer, or a data-processing apparatus. Herein, reference to a computer system may encompass one or more computer systems, where appropriate.

Computer system 1100 may take any suitable physical form. As an example, computer system 1100 may be an embedded computer system, a system-on-chip (SOC), a single-board computer system (SBC), a desktop computer system, a laptop or notebook computer system, a mainframe, a mesh of computer systems, a server, a tablet computer system, or any suitable combination of two or more of these. As another example, all or part of computer system 1100 may be combined with, coupled to, or integrated into a variety of devices, including, but not limited to, a camera, camcorder, personal digital assistant (PDA), mobile telephone, smartphone, electronic reading device (e.g., an e-reader), game console, smart watch, clock, calculator, television monitor, flat-panel display, computer monitor, vehicle display (e.g., odometer display or dashboard display), vehicle navigation system, lidar system, ADAS, autonomous vehicle, autonomous-vehicle driving system, cockpit control, camera view display (e.g., display of a rear-view camera in a vehicle), eyewear, or head-mounted display. Where appropriate, computer system 1100 may include one or more computer systems 1100; be unitary or distributed; span multiple locations; span multiple machines; span multiple data centers; or reside in a cloud, which may include one or more cloud components in one or more networks. Where appropriate, one or more computer systems 1100 may perform without substantial spatial or temporal limitation one or more steps of one or more methods described or illustrated herein. As an example, one or more computer systems 1100 may perform in real time or in batch mode one or more steps of one or more methods described or illustrated herein. One or more computer systems 1100 may perform at different times or at different locations one or more steps of one or more methods described or illustrated herein, where appropriate.

As illustrated in the example of FIG. 11, computer system 1100 may include a processor 1110, memory 1120, storage 1130, an input/output (I/O) interface 1140, a communication interface 1150, or a bus 1160. Computer system 1100 may include any suitable number of any suitable components in any suitable arrangement.

In particular embodiments, processor 1110 may include hardware for executing instructions, such as those making up a computer program. As an example, to execute instructions, processor 1110 may retrieve (or fetch) the instructions from an internal register, an internal cache, memory 1120, or storage 1130; decode and execute them; and then write one or more results to an internal register, an internal cache, memory 1120, or storage 1130. In particular embodiments, processor 1110 may include one or more internal caches for data, instructions, or addresses. Processor 1110 may include any suitable number of any suitable internal caches, where appropriate. As an example, processor 1110 may include one or more instruction caches, one or more data caches, or one or more translation lookaside buffers (TLBs). Instructions in the instruction caches may be copies of instructions in memory 1120 or storage 1130, and the instruction caches may speed up retrieval of those instructions by processor 1110. Data in the data caches may be copies of data in memory 1120 or storage 1130 for instructions executing at processor 1110 to operate on; the results of previous instructions executed at processor 1110 for access by subsequent instructions executing at processor 1110 or for writing to memory 1120 or storage 1130; or other suitable data. The data caches may speed up read or write operations by processor 1110. The TLBs may speed up virtual-address translation for processor 1110. In particular embodiments, processor 1110 may include one or more internal registers for data, instructions, or addresses. Processor 1110 may include any suitable number of any suitable internal registers, where appropriate. Where appropriate, processor 1110 may include one or more arithmetic logic units (ALUs); may be a multi-core processor; or may include one or more processors 1110.

In particular embodiments, memory 1120 may include main memory for storing instructions for processor 1110 to execute or data for processor 1110 to operate on. As an example, computer system 1100 may load instructions from storage 1130 or another source (such as, for example, another computer system 1100) to memory 1120. Processor 1110 may then load the instructions from memory 1120 to an internal register or internal cache. To execute the instructions, processor 1110 may retrieve the instructions from the internal register or internal cache and decode them. During or after execution of the instructions, processor 1110 may write one or more results (which may be intermediate or final results) to the internal register or internal cache. Processor 1110 may then write one or more of those results to memory 1120. One or more memory buses (which may each include an address bus and a data bus) may couple processor 1110 to memory 1120. Bus 1160 may include one or more memory buses. In particular embodiments, one or more memory management units (MMUs) may reside between processor 1110 and memory 1120 and facilitate accesses to memory 1120 requested by processor 1110. In particular embodiments, memory 1120 may include random access memory (RAM). This RAM may be volatile memory, where appropriate. Where appropriate, this RAM may be dynamic RAM (DRAM) or static RAM (SRAM). Memory 1120 may include one or more memories 1120, where appropriate.

In particular embodiments, storage 1130 may include mass storage for data or instructions. As an example, storage 1130 may include a hard disk drive (HDD), a floppy disk drive, flash memory, an optical disc, a magneto-optical disc, magnetic tape, or a Universal Serial Bus (USB) drive or a combination of two or more of these. Storage 1130 may include removable or non-removable (or fixed) media, where appropriate. Storage 1130 may be internal or external to computer system 1100, where appropriate. In particular embodiments, storage 1130 may be non-volatile, solid-state memory. In particular embodiments, storage 1130 may include read-only memory (ROM). Where appropriate, this ROM may be mask ROM (MROM), programmable ROM (PROM), erasable PROM (EPROM), electrically erasable PROM (EEPROM), flash memory, or a combination of two or more of these. Storage 1130 may include one or more storage control units facilitating communication between processor 1110 and storage 1130, where appropriate. Where appropriate, storage 1130 may include one or more storages 1130.

In particular embodiments, I/O interface 1140 may include hardware, software, or both, providing one or more interfaces for communication between computer system 1100 and one or more I/O devices. Computer system 1100 may include one or more of these I/O devices, where appropriate. One or more of these I/O devices may enable communication between a person and computer system 1100. As an example, an I/O device may include a keyboard, keypad, microphone, monitor, mouse, printer, scanner, speaker, camera, stylus, tablet, touch screen, trackball, another suitable I/O device, or any suitable combination of two or more of these. An I/O device may include one or more sensors. Where appropriate, I/O interface 1140 may include one or more device or software drivers enabling processor 1110 to drive one or more of these I/O devices. I/O interface 1140 may include one or more I/O interfaces 1140, where appropriate.

In particular embodiments, communication interface 1150 may include hardware, software, or both providing one or more interfaces for communication (such as, for example, packet-based communication) between computer system 1100 and one or more other computer systems 1100 or one or more networks. As an example, communication interface 1150 may include a network interface controller (NIC) or network adapter for communicating with an Ethernet or other wire-based network or a wireless NIC (WNIC); a wireless adapter for communicating with a wireless network, such as a WI-FI network; or an optical transmitter (e.g., a laser or a light-emitting diode) or an optical receiver (e.g., a photodetector) for communicating using fiber-optic communication or free-space optical communication. Computer system 1100 may communicate with an ad hoc network, a personal area network (PAN), an in-vehicle network (IVN), a local area network (LAN), a wide area network (WAN), a metropolitan area network (MAN), or one or more portions of the Internet or a combination of two or more of these. One or more portions of one or more of these networks may be wired or wireless. As an example, computer system 1100 may communicate with a wireless PAN (WPAN) (such as, for example, a BLUETOOTH WPAN), a WI-FI network, a Worldwide Interoperability for Microwave Access (WiMAX) network, a cellular telephone network (such as, for example, a Global System for Mobile Communications (GSM) network), or other suitable wireless network or a combination of two or more of these. As another example, computer system 1100 may communicate using fiber-optic communication based on 100 Gigabit Ethernet (100 GbE), 10 Gigabit Ethernet (10 GbE), or Synchronous Optical Networking (SONET). Computer system 1100 may include any suitable communication interface 1150 for any of these networks, where appropriate. Communication interface 1150 may include one or more communication interfaces 1150, where appropriate.

In particular embodiments, bus 1160 may include hardware, software, or both coupling components of computer system 1100 to each other. As an example, bus 1160 may include an Accelerated Graphics Port (AGP) or other graphics bus, a controller area network (CAN) bus, an Enhanced Industry Standard Architecture (EISA) bus, a front-side bus (FSB), a HYPERTRANSPORT (HT) interconnect, an Industry Standard Architecture (ISA) bus, an INFINIBAND interconnect, a low-pin-count (LPC) bus, a memory bus, a Micro Channel Architecture (MCA) bus, a Peripheral Component Interconnect (PCI) bus, a PCI-Express (PCIe) bus, a serial advanced technology attachment (SATA) bus, a Video Electronics Standards Association local bus (VLB), or another suitable bus or a combination of two or more of these. Bus 1160 may include one or more buses 1160, where appropriate.

In particular embodiments, various modules, circuits, systems, methods, or algorithm steps described in connection with the implementations disclosed herein may be implemented as electronic hardware, computer software, or any suitable combination of hardware and software. In particular embodiments, computer software (which may be referred to as software, computer-executable code, computer code, a computer program, computer instructions, or instructions) may be used to perform various functions described or illustrated herein, and computer software may be configured to be executed by or to control the operation of computer system 1100. As an example, computer software may include instructions configured to be executed by processor 1110. In particular embodiments, owing to the interchangeability of hardware and software, the various illustrative logical blocks, modules, circuits, or algorithm steps have been described generally in terms of functionality. Whether such functionality is implemented in hardware, software, or a combination of hardware and software may depend upon the particular application or design constraints imposed on the overall system.

In particular embodiments, a computing device may be used to implement various modules, circuits, systems, methods, or algorithm steps disclosed herein. As an example, all or part of a module, circuit, system, method, or algorithm disclosed herein may be implemented or performed by a general-purpose single- or multi-chip processor, a digital signal processor (DSP), an ASIC, a FPGA, any other suitable programmable-logic device, discrete gate or transistor logic, discrete hardware components, or any suitable combination thereof. A general-purpose processor may be a microprocessor, or, any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

In particular embodiments, one or more implementations of the subject matter described herein may be implemented as one or more computer programs (e.g., one or more modules of computer-program instructions encoded or stored on a computer-readable non-transitory storage medium). As an example, the steps of a method or algorithm disclosed herein may be implemented in a processor-executable software module which may reside on a computer-readable non-transitory storage medium. In particular embodiments, a computer-readable non-transitory storage medium may include any suitable storage medium that may be used to store or transfer computer software and that may be accessed by a computer system. Herein, a computer-readable non-transitory storage medium or media may include one or more semiconductor-based or other integrated circuits (ICs) (such, as for example, field-programmable gate arrays (FPGAs) or application-specific ICs (ASICs)), hard disk drives (HDDs), hybrid hard drives (HHDs), optical discs (e.g., compact discs (CDs), CD-ROM, digital versatile discs (DVDs), blue-ray discs, or laser discs), optical disc drives (ODDs), magneto-optical discs, magneto-optical drives, floppy diskettes, floppy disk drives (FDDs), magnetic tapes, flash memories, solid-state drives (SSDs), RAM, RAM-drives, ROM, SECURE DIGITAL cards or drives, any other suitable computer-readable non-transitory storage media, or any suitable combination of two or more of these, where appropriate. A computer-readable non-transitory storage medium may be volatile, non-volatile, or a combination of volatile and non-volatile, where appropriate.

In particular embodiments, certain features described herein in the context of separate implementations may also be combined and implemented in a single implementation. Conversely, various features that are described in the context of a single implementation may also be implemented in multiple implementations separately or in any suitable sub-combination. Moreover, although features may be described above as acting in certain combinations and even initially claimed as such, one or more features from a claimed combination may in some cases be excised from the combination, and the claimed combination may be directed to a sub-combination or variation of a sub-combination.

While operations may be depicted in the drawings as occurring in a particular order, this should not be understood as requiring that such operations be performed in the particular order shown or in sequential order, or that all operations be performed. Further, the drawings may schematically depict one more example processes or methods in the form of a flow diagram or a sequence diagram. However, other operations that are not depicted may be incorporated in the example processes or methods that are schematically illustrated. For example, one or more additional operations may be performed before, after, simultaneously with, or between any of the illustrated operations. Moreover, one or more operations depicted in a diagram may be repeated, where appropriate. Additionally, operations depicted in a diagram may be performed in any suitable order. Furthermore, although particular components, devices, or systems are described herein as carrying out particular operations, any suitable combination of any suitable components, devices, or systems may be used to carry out any suitable operation or combination of operations. In certain circumstances, multitasking or parallel processing operations may be performed. Moreover, the separation of various system components in the implementations described herein should not be understood as requiring such separation in all implementations, and it should be understood that the described program components and systems may be integrated together in a single software product or packaged into multiple software products.

Various embodiments have been described in connection with the accompanying drawings. However, it should be understood that the figures may not necessarily be drawn to scale. As an example, distances or angles depicted in the figures are illustrative and may not necessarily bear an exact relationship to actual dimensions or layout of the devices illustrated.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes or illustrates respective embodiments herein as including particular components, elements, functions, operations, or steps, any of these embodiments may include any combination or permutation of any of the components, elements, functions, operations, or steps described or illustrated anywhere herein that a person having ordinary skill in the art would comprehend.

The term "or" as used herein is to be interpreted as an inclusive or meaning any one or any combination, unless expressly indicated otherwise or indicated otherwise by context. Therefore, herein, the expression "A or B" means "A, B, or both A and B." As another example, herein, "A, B or C" means at least one of the following: A; B; C; A and B; A and C; B and C; A, B and C. An exception to this definition will occur if a combination of elements, devices, steps, or operations is in some way inherently mutually exclusive.

As used herein, words of approximation such as, without limitation, "approximately, "substantially," or "about" refer to a condition that when so modified is understood to not necessarily be absolute or perfect but would be considered close enough to those of ordinary skill in the art to warrant designating the condition as being present. The extent to which the description may vary will depend on how great a change can be instituted and still have one of ordinary skill in the art recognize the modified feature as having the required characteristics or capabilities of the unmodified feature. In general, but subject to the preceding discussion, a numerical value herein that is modified by a word of approximation such as "approximately" may vary from the stated value by ±0.5%, ±1%, ±2%, ±3%, ±4%, ±5%, ±10%, ±12%, or ±15%.

As used herein, the terms "first," "second," "third," etc. may be used as labels for nouns that they precede, and these terms may not necessarily imply a particular ordering (e.g., a particular spatial, temporal, or logical ordering). As an example, a system may be described as determining a "first result" and a "second result," and the terms "first" and "second" may not necessarily imply that the first result is determined before the second result.

As used herein, the terms "based on" and "based at least in part on" may be used to describe or present one or more factors that affect a determination, and these terms may not exclude additional factors that may affect a determination. A determination may be based solely on those factors which are presented or may be based at least in part on those factors. The phrase "determine A based on B" indicates that B is a factor that affects the determination of A. In some instances, other factors may also contribute to the determination of A. In other instances, A may be determined based solely on B.

What is claimed is:

1. A lidar system comprising:
   a light source configured to emit pulses of light along a field of view of the light source;
   a scanner configured to scan the field of view of the light source and a field of view of a receiver across a field of regard of the lidar system, wherein:
     the light-source field of view and the receiver field of view are scanned in a scan direction across the field of regard at approximately equal scanning speeds; and
     the receiver field of view is offset from the light-source field of view in a direction opposite the scan direction;
   the receiver, wherein the receiver is configured to detect a portion of the emitted pulses of light scattered by a target located a distance from the lidar system, wherein the receiver comprises:
     an aluminum-indium-arsenide-antimonide (AlInAsSb) avalanche photodiode (APD) configured to:
       receive a pulse of light of the portion of the emitted pulses of light scattered by the target; and
       produce an electrical-current pulse corresponding to the received pulse of light; and
     a pulse-detection circuit configured to receive the electrical-current pulse from the AlInAsSb APD, wherein the pulse-detector circuit comprises:
       a transimpedance amplifier configured to produce a voltage pulse that corresponds to the electrical-current pulse;
       a voltage amplifier configured to amplify the voltage pulse to produce an amplified voltage pulse; and
       a comparator configured to produce a digital output signal when the amplified voltage pulse exceeds a particular threshold voltage; and
   a processor configured to determine the distance from the lidar system to the target based at least in part on a round-trip time of flight for the received pulse of light to travel from the lidar system to the target and back to the lidar system.

2. The lidar system of claim 1, wherein the AlInAsSb APD has an excess noise factor of less than three.

3. The lidar system of claim 1, wherein a reverse-bias voltage applied to the AlInAsSb APD is greater than 20 volts.

4. The lidar system of claim 1, wherein a gain of the AlInAsSb APD is greater than 10.

5. The lidar system of claim 1, wherein the AlInAsSb APD is configured to detect light having a wavelength between 900 nm and 1700 nm.

6. The lidar system of claim 1, wherein the pulse-detection circuit further comprises a time-to-digital converter (TDC) configured to:
   receive the digital output signal from the comparator; and
   determine an interval of time between an emission time when a pulse of light corresponding to the received pulse of light was emitted by the light source and a receipt time when the digital output signal was received by the TDC, wherein the interval of time corresponds to the round-trip time of flight for the received pulse of light to travel from the lidar system to the target and back to the lidar system.

7. The lidar system of claim 6, wherein the emission time when the pulse of light corresponding to the received pulse of light was emitted by the light source is determined from an optical trigger signal associated with detection by the receiver of a portion of the pulse of light which is scattered or reflected from a surface located within the lidar system prior to exiting the lidar system and propagating to the target.

8. The lidar system of claim 1, wherein the light source comprises:
   a pulsed laser diode configured to produce optical seed pulses; and
   one or more optical amplifiers configured to amplify the optical seed pulses to produce the emitted pulses of light.

9. The lidar system of claim 1, wherein the light source comprises a direct-emitter laser diode configured to produce the emitted pulses of light.

10. The lidar system of claim 1, wherein each emitted pulse of light has a pulse energy of less than 1 microjoule.

11. The lidar system of claim 1, wherein the emitted pulses of light have pulse characteristics comprising:
    a wavelength between 900 nm and 1700 nm;
    a pulse repetition frequency of less than 10 MHz;
    a pulse duration of less than 100 ns; and
    a duty cycle of less than 5%.

12. The lidar system of claim 1, wherein the scanner comprises one or more mirrors, wherein each mirror is mechanically driven by a galvanometer scanner, a resonant scanner, a microelectromechanical systems (MEMS) device, a voice coil motor, or a synchronous electric motor.

13. The lidar system of claim 1, wherein the scan direction is a second scan direction, and the scanner comprises:
    a first mirror driven by a first galvanometer scanner that scans the emitted pulses of light along a first scan direction; and
    a second mirror driven by a second galvanometer scanner that scans the emitted pulses of light along the second scan direction, wherein the second scan direction is substantially orthogonal to the first scan direction.

14. The lidar system of claim 1, wherein the scan direction is a second scan direction, and the scanner comprises:
    a first mirror configured to scan the emitted pulses of light along a first scan direction; and a polygon mirror configured to scan the emitted pulses of light along the second scan direction, wherein the second scan direction is substantially orthogonal to the first scan direction.

15. The lidar system of claim 1, wherein the lidar system is incorporated into a vehicle and configured to provide a greater than 60-degree view of an environment around the vehicle.

16. The lidar system of claim 1, wherein the lidar system is configured to generate point clouds at a rate between 0.1 frames per second and 1,000 frames per second.

17. The lidar system of claim 1, wherein the lidar system has a maximum range of greater than 50 meters.

18. The lidar system of claim 1, wherein the field of regard comprises:
   a horizontal field of regard greater than or equal to 25 degrees; and
   a vertical field of regard greater than or equal to 5 degrees.

19. The lidar system of claim 1, wherein the lidar system is a Class 1 or Class I laser product configured to operate in an eye-safe manner.

20. The lidar system of claim 1, wherein the comparator is further configured to produce another digital output signal when the amplified voltage pulse falls below the particular threshold voltage.

21. The lidar system of claim 1, wherein the AlInAsSb APD comprises an absorption layer with a composition $Al_xIn_{1-x}As_ySb_{1-y}$, wherein x and y each has a value from 0 to 1.

22. The lidar system of claim 1, wherein the AlInAsSb APD comprises an avalanche layer with a composition $Al_xIn_{1-x}As_ySb_{1-y}$, wherein x and y each has a value from 0 to 1.

23. The lidar system of claim 1, wherein the receiver field of view is offset from the light-source field of view so that the receiver field of view has an angular overlap with the light-source field of view of less than 50%.

* * * * *